US012748595B2

(12) United States Patent
Oberhuber et al.

(10) Patent No.: US 12,748,595 B2
(45) Date of Patent: Sep. 29, 2026

(54) METHODS AND APPARATUS TO SEQUENCE ANALOG TO DIGITAL CONVERSIONS

(71) Applicant: Texas Instruments Incorporated, Dallas, TX (US)

(72) Inventors: Ralph Georg Oberhuber, Oro Valley, AZ (US); Shawn Xianggang Yu, Tucson, AZ (US); Joachim Erwin Wuerker, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 114 days.

(21) Appl. No.: 18/819,863

(22) Filed: Aug. 29, 2024

(65) Prior Publication Data

US 2026/0064419 A1 Mar. 5, 2026

(51) Int. Cl.

| | |
|---|---|
| ***G06F 9/32*** | (2018.01) |
| ***G06F 9/30*** | (2018.01) |
| ***G06F 11/30*** | (2006.01) |
| *H03M 1/08* | (2006.01) |

(52) U.S. Cl.

CPC .............. *G06F 9/32* (2013.01); *G06F 9/3004* (2013.01); *G06F 11/3065* (2013.01); *G06F 9/30145* (2013.01); *H03M 1/08* (2013.01)

(58) Field of Classification Search

CPC ...... G06F 9/32; G06F 9/3004; G06F 11/3065; G06F 9/30145; H03M 1/08

See application file for complete search history.

(56) References Cited

U.S. PATENT DOCUMENTS 6,831,583 B1 * 12/2004 O'Dowd .................. G06F 3/05 341/155

10,852,360 B2 12/2020 Brychta et al.

OTHER PUBLICATIONS

Analog Devices, Inc., "Data Sheet AD4111-Single Supply, 24-Bit, Sigma-Delta ADC with ±10 V and 0 mA to 20 mA Inputs, Open Wire Detection," dated 2018, 59 pages.

Texas Instruments, "ADS131B26-Q1 Automotive High-Voltage Battery Pack Monitor With SPI and 6 ADC Channels for Voltage, Current, and Temperature Sensing," dated Sep. 2022, revised Jul. 2023, 249 pages.

Texas Instruments, "Datasheet ADS1258—16-Channel, 24-Bit Analog-to-Digital Converter," Jun. 2005-Revised Mar. 2011, 55 pages.

* cited by examiner

*Primary Examiner* — Joseph J Lauture

(74) *Attorney, Agent, or Firm* — Xianghui Huang; Frank D. Cimino

(57) ABSTRACT

An example apparatus includes: initialization circuitry to: enable a first step settings page and a second step settings page; and disable a third step settings page; sequencer circuitry configured to execute a sequence of operations, the sequence including: instruct ADC circuitry to perform, in a sequence, different numbers of conversions using different settings values, the settings values provided from the first step settings page and the second step settings page; skip the third step settings page; and monitor circuitry configured to report, during the performance of the conversions and to an external device, one or more of: an index that corresponds to the settings values currently being used by the ADC circuitry; a number of conversions completed by the ADC circuitry using a current step settings page; or a number of iterations of the sequence completed by the ADC circuitry.

20 Claims, 10 Drawing Sheets

CONTROL SETTINGS
304

| | BIT FIELD | SHORT DESCRIPTION | DESCRIPTION |
|---|---|---|---|
| 402<br>404 | PAGE_POINTER[7:0]<br>PAGE_INDICATOR[7:0] | PAGE POINTER,<br>PAGE INDICATOR | POINTER AND INDICATOR FOR PAGE ADDRESSING |
| 406 | SEQ_MODE[1:0] | SEQUENCER<br>MODE SELECTION | ENABLES: A) SINGLE SHOT, B) SINGLE STEP CONTINUOUS,<br>C) SINGLE SEQUENCE, OR D) CONTINUOUS SEQUENCE MODE |
| 306 | SEQ_STEP_x_EN | SEQUENCE<br>STEP ENABLE | 32 SEQUENCE STEPS, x = 1 TO 32, ONE<br>ENABLE BIT FOR EACH STEP |
| 410 | STEP_INIT[4:0] | POINTER TO FIRST<br>SEQUENCE STEP | SELECTS THE STEP NUMBER FOR STARTING THE SEQUENCE |
| 412<br>414 | START<br>STOP | START/STOP CONTROL | TRIGGERS START/STOP OF SEQUENCE |
| 416 | STOP_BEHAVIOR[1:0] | STOP MODE SELECTION | SELECTS OPERATION OF SEQUENCER AFTER STOP BIT IS SET |
| 418 | DRDY_CFG[1:0] | SELECTION OF<br>$\overline{\text{DRDY}}$ BEHAVIOR | SELECTS WHETHER DRDY SIGNAL INDICATES NEW DATA<br>AFTER EVERY CONVERSION/EVERY SEQUENCE<br>STEP/EVERY SEQUENCE/REACHING FIFO THRESHOLD |

FIG. 4

406

| SEQ_MODE[1:0] | DESCRIPTION |
|---|---|
| 00 | SINGLE-SHOT MODE, NO SEQUENCING. STEP DEFINED BY STEP_INIT[4:0] BITS IS EXECUTED ONLY ONCE |
| 01 | SINGLE STEP CONTINUOUS CONVERSION MODE, NO SEQUENCING. STEP DEFINED BY STEP_INIT[4:0] IS EXECUTED INDEFINITELY |
| 10 | SINGLE SEQUENCE MODE: EACH ENABLED SEQUENCE STEP IS EXECUTED ONCE |
| 11 | CONTINUOUS SEQUENCE MODE: THE SEQUENCE IS REPEATED INDEFINITELY |

FIG. 5

406 416

<table>
<tr><th rowspan="2">SEQ_MODE[1:0]</th><th colspan="4">STOP_BEHAVIOR[1:0]</th></tr>
<tr><th>00</th><th>01</th><th>10</th><th>11</th></tr>
<tr><td>00</td><td rowspan="4">STOP IMMEDIATELY</td><td>STOP AFTER CURRENT CONVERSION COMPLETES</td><td colspan="2">STOP AFTER CURRENT STEP COMPLETES</td></tr>
<tr><td>01</td><td colspan="3">STOP AFTER CURRENT CONVERSION COMPLETES</td></tr>
<tr><td>10</td><td rowspan="2">STOP AFTER CURRENT CONVERSION COMPLETES</td><td rowspan="2">STOP AFTER CURRENT STEP COMPLETES</td><td rowspan="2">STOP AFTER CURRENT SEQUENCE ITERATION COMPLETES</td></tr>
<tr><td>11</td></tr>
</table>

FIG. 6

STATUS DATA 310

| | BIT FIELD | SHORT DESCRIPTION | DESCRIPTION |
|---|---|---|---|
| | | INDICATORS | |
| 702 | **SEQ_ACTIVE** | SEQUENCER ACTIVE INDICATOR | INDICATES IF SEQUENCER IS ACTIVE |
| 704 | **SEQ_COUNT[3:0]** | SEQUENCE COUNTER | COUNTER FOR COMPLETING FULL SEQUENCE ITERATIONS |
| 706 | **STEP_INDICATOR[4:0]** | SEQUENCE STEP NUMBER INDICATOR | INDICATES THE INDEX OF THE CURRENT STEP SETTINGS PAGE |
| 708 | **CONV_COUNT[3:0]** | CONVERSION NUMBER INDICATOR | INDICATES THE CONVERSION NUMBER FOR THE LATEST COMPLETED CONVERSION RESULT |

FIG. 7

STATUS DATA 310

| | THRESHOLD SETTING | TRIGGER CONDITION | $\overline{DRDY}$ TRANSITION |
|---|---|---|---|
| 802 | FIFO_THRES_A ≥ FIFO_THRES_B | FIFO_DEPTH > FIFO_THRES_A | $\overline{DRDY}$ FALLING EDGE |
| | | FIFO_DEPTH ≤ FIFO_THRES_B | $\overline{DRDY}$ RISING EDGE |
| | **THRESHOLD SETTING** | **TRIGGER CONDITION** | **$\overline{DRDY}$ TRANSITION** |
| 804 | FIFO_THRES_A < FIFO_THRES_B | FIFO_DEPTH > FIFO_THRES_B | $\overline{DRDY}$ FALLING EDGE |
| | | FIFO_DEPTH ≤ FIFO_THRES_A | $\overline{DRDY}$ RISING EDGE |

FIG. 8

STEP SETTINGS PAGE
308-x

| | BIT FIELD | DESCRIPTION |
|---|---|---|
| 902<br>904 | STEPx_AINP[4:0]<br>STEPx_AINN[4:0] | SELECTION OF POSITIVE AND NEGATIVE ANALOG INPUT FOR ADC |
| 906 | STEPx_EXT_RNG | SELECTION OF RANGE FOR EXTERNAL REFERENCE |
| 908 | STEPx_REF_SEL | SELECTION OF EXTERNAL VS INTERNAL VOLTAGE REFERENCE |
| 910 | CODING | CONVERSION DATA CODING SELECTION, TWO'S COMPLEMENT OR UNIPOLAR |
| 912 | STEPx_NUM_CONV[3:0] | NUMBER OF ADC CONVERSIONS TO BE EXECUTED DURING THIS SEQUENCE STEP |
| 914 | STEPx_FLTR_OSR[4:0] | OSR FOR DIGITAL FILTER |
| 916 | STEPx_FLTR_MODE | SELECTION OF FILTER MODE SINC3 VS SINC4 |
| 918 | STEPx_DELAY_MSB[7:0] | CONVERSION-START DELAY TIME SELECTION |
| 920 | STEPx_OFFSET[23:0] | ADC OFFSET CALIBRATION VALUE |
| 922 | STEPx_GAIN[15:0] | ADC GAIN CALIBRATION VALUE |

FIG. 9

METHODS AND APPARATUS TO SEQUENCE ANALOG TO DIGITAL CONVERSIONS

TECHNICAL FIELD

This description relates generally to analog to digital converters (ADC) and, more particularly, to methods and apparatus to sequence conversions.

BACKGROUND

Information may be represented in electronic devices as either a digital or analog signal. In many applications, information requires conversion from an analog signal to a digital signal. For example, an analog voltage may be received over a transmission medium. The analog voltage may be transformed into a digital value. The digital voltage may be stored in a memory circuit, interpreted by processor circuitry, etc. ADC circuits perform the conversion of analog values to digital voltages and are used in a variety of computing devices.

SUMMARY

For methods and apparatus to sequence analog to digital conversions, a first apparatus includes: analog to digital converter (ADC) circuitry having: an input terminal configured to receive a voltage from an analog input; and an output terminal configured to provide digital values; and a memory having: an input terminal coupled to the output terminal of the ADC circuitry; and a second output terminal; control circuitry having: an input terminal coupled to the second output terminal of the memory the control circuitry configured to: perform a sequence of operations responsive to instructions in memory; the sequence to include at least: Instructing the ADC circuitry to perform a first number of conversions using first settings values stored in the memory; instructing the ADC circuitry to perform a second number of conversions using second settings values stored in the memory; and skipping third settings values in the memory; and report, during the performance of the conversions and to an external device, one or more of: a description of which settings values are currently being used by the ADC circuitry a number of conversions completed by the ADC circuitry using the current settings values; or a number of iterations of the sequence completed by the ADC circuitry.

A second apparatus comprises: initialization circuitry configured to: enable a first step settings page and a second step settings page using a first enable bit and a second enable bit stored in memory; and disable a third step settings page using a third enable bit in the memory; sequencer circuitry configured to execute a sequence of operations, the sequence including: instruct ADC circuitry to perform, in a sequence, different numbers of conversions using different settings values, the settings values provided from the first step settings page and the second step settings page responsive to the first enable bit and the second enable bit; skip the third step settings page responsive to the third enable bit; and monitor circuitry configured to report, during the performance of the conversions and to an external device, one or more of: an index of the step settings page that corresponds to the settings values currently being used by the ADC circuitry; a number of conversions completed by the ADC circuitry using a current step settings page; or a number of iterations of the sequence completed by the ADC circuitry.

A non-transitory machine-readable storage medium comprises: a first step settings page storing first Analog to Digital Conversion (ADC) setting values; a second step settings page storing second ADC setting values; and a third step settings page storing third ADC setting values; and a general settings page storing: a first enable bit that enables the first settings page; a second enable bit that disables the second settings page; a third enable bit that enables the third settings page; wherein programmable circuitry coupled to the non-transitory machine-readable storage medium is configured to: instruct ADC circuitry to perform, in a sequence, different numbers of conversions using different settings values, the settings values provided from the first step settings page and the third step settings page responsive to the first enable bit and the third enable bit; skip the second step settings page responsive to the second enable bit; and report, during the performance of the conversions and to an external device, one or more of: an index of the step settings page that corresponds to the settings values currently being used by the ADC circuitry; a number of conversions completed by the ADC circuitry using a current step settings page; or a number of iterations of the sequence completed by the ADC circuitry.

BRIEF DESCRIPTION OF THE DRAWINGS

FIG. 4 is an example implementation of the control settings described in FIG. 3.

FIG. 5 is an example implementation of the sequence mode setting described in FIG. 4.

FIG. 6 is an example implementation of the stop setting described in FIG. 4.

FIG. 7 is an example implementation of first parameters in the status data of FIG. 3.

FIG. 8 is an example implementation of second parameters in the status data of FIG. 3.

FIG. 9 is an example implementation of a step settings page as described in FIG. 3.

Figure 1:
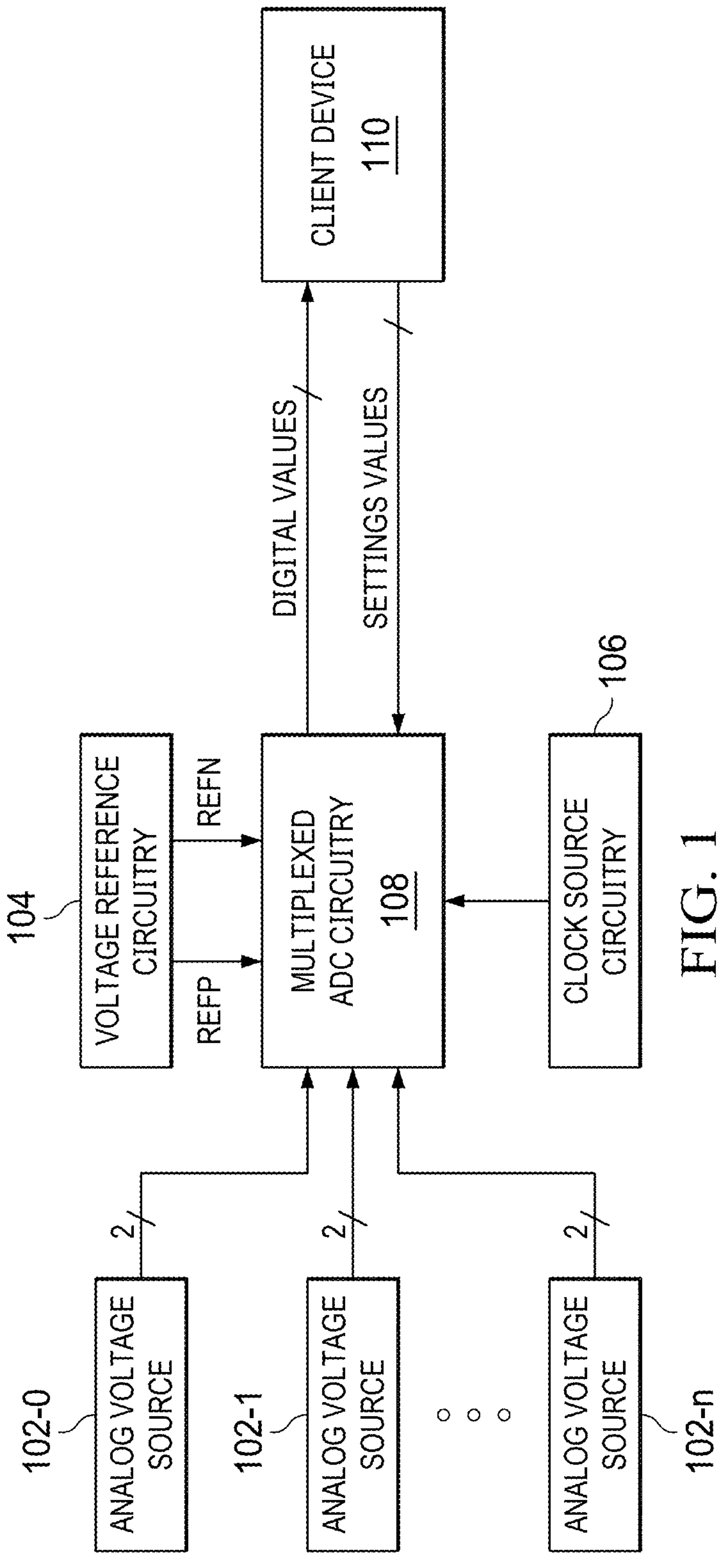
FIG. 1 is a block diagram of an example environment in which example ADC circuitry operates to perform conversions.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Manufacturers may employ a wide variety of ADC architectures to support various use cases. One such architecture is a multiplexed ADC. A multiplexed ADC refers to a system in which an ADC circuit connects to multiple analog voltage sources using a multiplexer circuit. After a specific voltage source from the group is selected using the multiplexer, the ADC circuit can perform analog to digital conversions using the input voltage produced by the selected source. In some examples, a multiplexed ADC architecture may be referred to as a type of multichannel ADC.

The digital values produced by an ADC are responsive to the settings used by the ADC during the conversion operations. For example, an ADC may produce one digital value when performing conversion operations with a first group of settings and an input voltage but produce a different digital value when performing conversion operations with a second group of settings and the same input voltage. Examples of settings used by an ADC and their effect on the digital value are described further in connection with FIG. 9.

A multiplexed ADC may connect to any number and any type of analog voltage sources. The various voltage sources may be generated in different environments, represent different information, or used in different contexts. Accordingly, a need exists for multiplexed ADCs to quickly change conversion settings to support the varying requirements of the multiple analog voltage sources. For example, functional safety capability and certification is an increasing trend in many markets, including but not limited to automotive and industrial areas. Such certification requires the capability of diagnostic measurements to be taken in between process quantity measurements. Accordingly, the certification requires an ADC to use some settings when performing diagnostic measurements and use other settings when performing process quantity measurements, and for the ADC to be able to quickly and accurately switch between the modes. Transmitting new settings to the ADC between measurements on different channels is time-consuming because the rate at which settings can be communicated across a digital interface (e.g., Serial Peripheral Interface (SPI)), may be less than the speed at which measurements need to be taken to measure a fast-changing signal.

Some existing multiplexed ADC architectures can change between settings by storing different settings values in memory. In such architectures, the ADC performs conversions using each group of setting values in a rotating fashion. In such a rotating fashion, the ADC performs first conversions with first settings values stored in a first index, then second conversions with second settings values stored at a second index, etc. Once the last settings of values have been used, existing multiplexed ADCs begin again with the first conversions using first setting values stored at a first index.

While existing multiplexed ADCs can rotate through different settings values, the ADCs lack the ability to change the order of the settings values that are used. Also, the rotating settings values in existing ADCs contain only some of the setting values that influence the result of conversion operations. If other settings not referenced in memory need to be changed, the multiplexed ADC has to wait for additional instructions from an external source to implement the changes. When performing conversions, the existing ADC also provides little to no feedback describing the status of the conversions (e.g., how many conversions have been performed, which settings values were used, etc.). The foregoing limitations result in existing multiplexed ADCs lacking the flexibility to support a wide variety of use cases from connected devices.

Example methods, apparatus, and systems described herein implement a multiplexed ADC architecture with greater flexibility than existing alternatives. Example ADC circuitry connects to an example memory and example control circuitry. The example memory includes multiple step settings page that store groups of settings values, and a general settings page. The control circuitry uses the general settings page to enable or disable each of the step settings pages in memory, and to assign an arbitrary order to the enabled pages. The ADC circuitry then begins a sequence of operations that uses different numbers of conversions using different settings values. In particular, the ADC circuitry use the settings values on the enabled pages in the arbitrary order while skipping the settings values on the disabled pages. The individual settings pages store a greater number of parameters that influence the conversion operations than existing ADC architectures. The control circuitry also monitors the ADC circuitry and provides various parameters that describe the status of the conversion operations to a client device. Additional modes and control options that are not present in existing ADC architectures are available in the teachings herein and described further below. As a result, the example multiplexed ADC circuitry described herein provides greater flexibility and supports a wider variety of use cases than existing approaches.

FIG. 1 is a block diagram of an example environment that includes multiplexed ADC circuitry. FIG. 1 includes example analog voltage sources 102-0, 102-1, . . . , 102-*n* (collectively referred to as analog voltage sources 102), example voltage reference circuitry 104, example clock source circuitry 106, example multiplexed ADC circuitry 108, and an example client device 110.

The analog voltage sources 102 refer to devices, systems, or circuits that can provide analog voltages as inputs to the multiplexed ADC circuitry 108. The analog voltages may represent any type or quantity of information. For example, one or more of the analog voltage sources 102 refer to sensors that describe process quantities including but not limited to pressure, temperature, flow, etc. In such an example, other analog voltage sources 102 can also be used to perform diagnostic measurement of the systems (e.g., determine an intermediate voltage or current corresponding to a sensor). In other examples, one or more of the analog voltage sources 102 are implemented with a different device or convey different information.

In the examples described herein, a given analog voltage source 102-0 provides two voltages as input because the multiplexed ADC circuitry 108 implements differential signaling. In other examples, a given analog voltage source 102-0 provides a single voltage as an input because the multiplexed ADC circuitry 108 implements single-ended signaling. The multiplexed ADC circuitry 108 may couple to any number of analog voltage sources 102.

The voltage reference circuitry 104 provides a positive reference voltage (REFP) and a negative reference voltage (REFN) to the multiplexed ADC circuitry 108. In examples described herein, the voltage reference circuitry 104 positive and negative portions of a reference signal because one or more of the analog voltage sources 102 encode information as a differential signal. In other examples, the voltage reference circuitry 104 provides a single reference voltage to support a single-ended signal. The voltage reference circuitry 104 may provide any voltage values as REFP or REFN. In some examples, the voltage reference circuitry 104 generates REFP and REFN using a system-level power supply.

In general, reference voltages are used by the multiplexed ADC circuitry 108 to perform comparisons during conversion operations. For example, the multiplexed ADC circuitry 108 may convert an analog input voltage to a first digital value if the analog input voltage is greater than a reference voltage. Alternatively, the multiplexed ADC circuitry 108 may convert the same analog input voltage to a second, different digital value if the same analog input voltage is less than the reference voltage. More generally, the multiplexed ADC circuitry 108 may perform multiple comparisons to convert an analog input voltage into a digital value having multiple bits. Accordingly, the value of REFP and REFN is one example of a setting that affects how the multiplexed ADC circuitry 108 performs conversion operations to produce digital values.

The clock source circuitry 106 provides a clock signal to the multiplexed ADC circuitry 108. As used herein, a clock signal refers to a periodic waveform that changes values at a set frequency. The multiplexed ADC circuitry 108 uses the clock signal to perform conversion operations with specific timing requirements (e.g., to measure the value of an analog voltage source 102-0 every x microseconds). The clock source circuitry 106 may be implemented using any suitable architecture that generates a stable clock signal, including but not limited to resonant devices such as piezo-electric oscillators.

The multiplexed ADC circuitry 108 converts an analog voltages to a digital values responsive to the settings values provided by the client device 110. The settings values include but are not limited to, which of the analog voltage sources 102 to use as an input, when to sample the input, which reference voltage to use when converting the sample to a digital value, how many conversions to perform on the current input, which of the analog voltage sources 102 to select after the conversions for the current input have completed, other internal values used by the multiplexed ADC circuitry 108, etc. settings values provided by the client devices 110 are described further below.

In examples described herein, the multiplexed ADC circuitry 108 is implemented as a standalone integrated circuit (IC) that is designed and manufactured to operate independently of the analog voltage sources 102-0, the voltage reference circuitry 104, the clock source circuitry 106, and the client device 110. In such examples, the client device 110 may be referred to as an external device. In other examples, one or more components of the multiplexed ADC circuitry 108 are implemented on a shared IC with other components as part of a larger system. The multiplexed ADC circuitry 108 is described further below in connection with FIG. 2.

The client device 110 uses the digital values to perform any type of operations. For example, if the digital values represent process quantities as described above, the client device 110 may check the quantities are within an expected range for safe operations of a system. If the client device 110 determines the quantities are outside of the expected range, the client device 110 may alert another component within the system of an issue and perform corrective actions. Similarly, the client device 110 may select any settings values supported by the multiplexed ADC circuitry 108 responsive to the requirements of a particular use case. The client device 110 may be implemented by any type of programmable circuitry and implement any type of logic. Examples of programmable circuitry include but are not limited to programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs).

Figure 2:
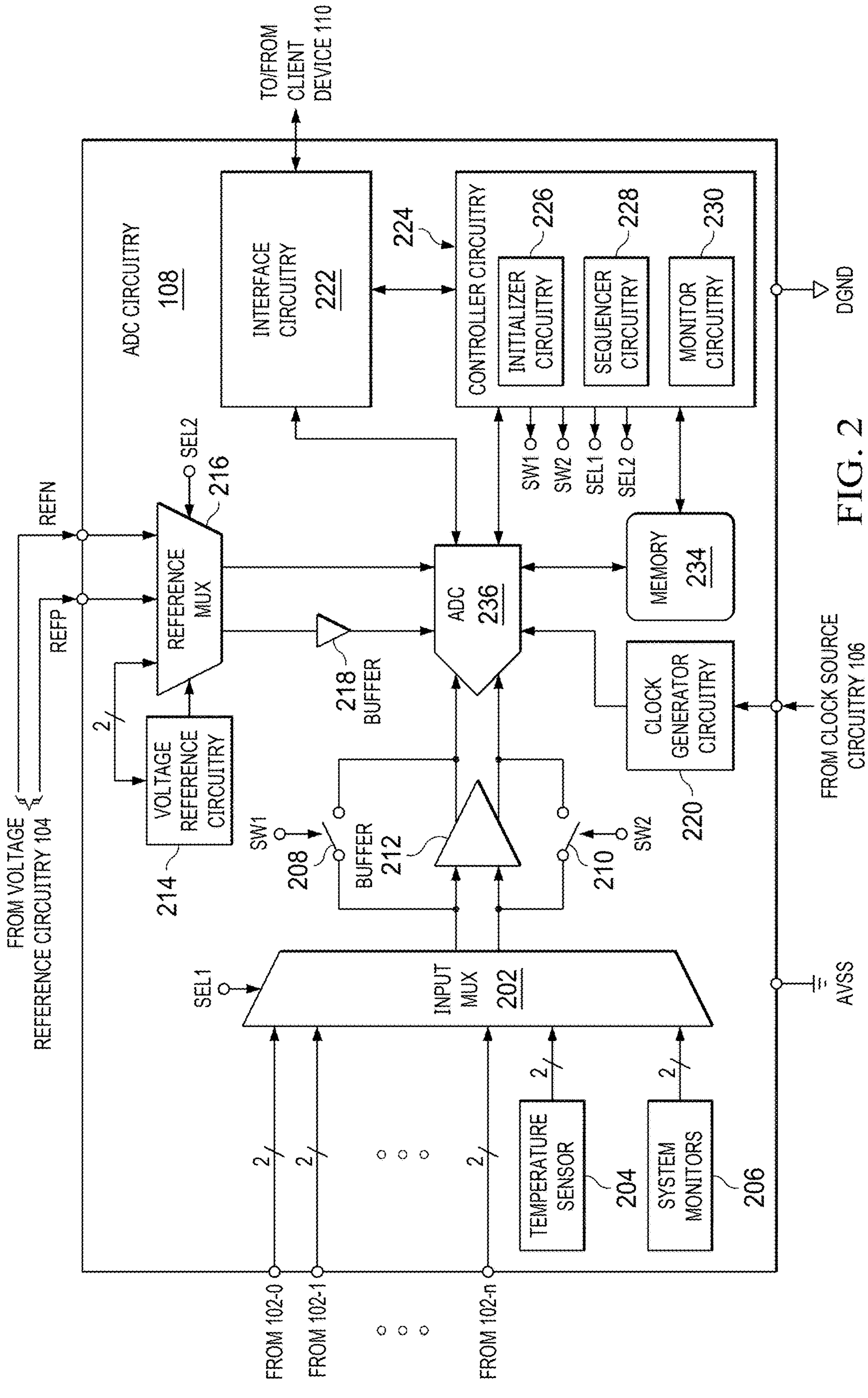
FIG. 2 is a block diagram of an example implementation of the ADC circuitry of FIG. 1.

FIG. 2 is a block diagram of an example implementation of the multiplexed ADC circuitry 108 of FIG. 1 to convert analog input voltages to digital values. FIG. 2 includes example input multiplexer circuitry 202 (which may be referred to herein as input mux 202), an example temperate sensor 204, example system monitors 206, example switches 208 and 210, example buffer circuitry 212 and 218, example voltage reference circuitry 214, example reference multiplexer circuitry 216 (which may be referred to herein as reference mux 216), example clock generator circuitry 220, example interface circuitry 222, example controller circuitry 224, example memory 234, and example ADC circuitry 236. The controller circuitry 224 includes example initializer circuitry 226, example sequencer circuitry 228, and example monitor circuitry 230.

The input mux 202 includes n terminals that couple to the n analog voltage sources 102 of FIG. 1. The input mux 202 also includes additional input terminals coupled to the temperature sensor 204 (which provides analog voltages representative of the internal temperature within the IC that implements the multiplexed ADC circuitry 108) and the system monitors 206 (which provides analog voltages used for internal testing). In the examples described herein, the input mux 202 has two output terminals to support differential signaling. In other examples, the input mux 202 has one output terminal to support single ended signaling.

The input mux 202 also has a control terminal that receives a selection signal (labelled SEL1 in FIG. 2) from the controller circuitry 224. The SEL1 signal indicates selects one pair of input terminals of the input mux 202. The input mux 202 then passes the voltage at the selected input terminals to the output terminals.

The switches 208 and 210 couple the output terminals of the input mux 202 directly to the ADC circuitry 236. Accordingly, when the switches 208 and 210 are closed, the ADC circuitry 236 receives the same voltage that is present at the selected input terminals of the input mux 202. Alternatively, when the switches are open, the direct electrical connection between the output terminals of the input mux 202 is broken and the voltages are instead provided to the buffer circuitry 212. The switch 208 opens and closes responsive to a SW1 signal sent by the controller circuitry 224. Similarly, the switch 210 opens and closes responsive to a SW2 signal sent by the controller circuitry 224.

The buffer circuitry 212 includes a first input terminal coupled to the first output terminal of the input mux 202 and a first output terminal coupled to the first input terminal of the ADC circuitry 236. The buffer circuitry 212 also includes a second input terminal coupled to the second output terminal of the input mux 202 and a second output terminal coupled to the second input terminal of the ADC circuitry 236. The buffer circuitry 212 acts as an analog driver that boosts the current of a signal, thereby increasing the impedance (and, by extension, the quality) of the signals that are provided to the ADC circuitry 236.

Like the voltage reference circuitry 104, the voltage reference circuitry 214 provides a positive reference voltage and a negative reference voltage to input terminals of the reference mux 216. The voltage reference circuitry 214 generates signals independently from the voltage reference circuitry 104, so the values of the reference voltages may be different from one another. In examples described herein, an output of the voltage reference circuitry 214 is referred to as an internal reference voltage because the voltage reference circuitry 214 is implemented within the multiplexed ADC circuitry 108. Similarly, an output of the voltage reference circuitry 104 may be referred to as an external reference voltage because the voltage reference circuitry 104 is not implemented within the multiplexed ADC circuitry 108.

The reference mux 216 has one output terminal for a positive reference voltage (REFP) and one output terminal for a negative reference voltage (REFN). The reference mux 216 also includes a control terminal that receives a selection signal (labeled SEL2 in FIG. 2) from the controller circuitry 224. The value of the SEL2 signal indicates a selection of either the internal reference voltages from the voltage reference circuitry 214 or the external reference voltages from the voltage reference circuitry 104. The reference mux 216 then passes the selected signals to its corresponding output terminals. In examples described herein, REFN is coupled to ground and can therefore be provided directly to the ADC circuitry 236. In contrast, REFP passes through the buffer circuitry 218 before reaching the ADC circuitry 236. Like the buffer circuitry 212, the buffer circuitry 218 increases the input impedance of the positive reference voltage to improve signal quality.

The clock generator circuitry 220 converts the clock signal from the clock source circuitry 106 into a clock signal that is interpretable by the ADC circuitry 236. In some examples, the clock generator circuitry 220 changes the shape or speed of the original clock signal to produce a value that is interpretable by the ADC circuitry 236.

The interface circuitry 222 enables communication between the ADC circuitry 236, controller circuitry 224, and the client device 110. For example, the client device 110 provides the settings values to the interface circuitry 222 in a format that is interpretable by the controller circuitry 224. As another example, the controller circuitry 224 uses the interface circuitry 222 to provide instructions to the ADC circuitry 236. The instructions may include any information that affect conversion operations as described further in connection with FIGS. 9 and 11. In a third example, the ADC circuitry 236 provides the digital values that result from the conversion operations to the client device 110 using the interface circuitry 222.

The interface circuitry 222 may include any number of terminals, wire traces, interconnects, or other hardware components required to send and receive signals between the ADC circuitry 236, controller circuitry 224, and the client device 110. The interface circuitry 222 may use any suitable communication protocol to ensure the messages transmitted between the foregoing components have consistent formatting, avoid cross talk, etc. In the example of FIG. 2, the interface circuitry 222 is implemented using the Serial Peripheral Interface (SPI) protocol. In other examples, the interface circuitry 222 implements a different communication protocol.

The controller circuitry 224 of FIG. 2 may be instantiated (e.g., creating an instance of, bring into being for any length of time, materialize, implement, etc.) as a hardware logic device such as (i) an Application Specific Integrated Circuit (ASIC) or (ii) a Field Programmable Gate Array (FPGA) structured in response to execution of second instructions to perform operations corresponding to the first instructions. Also or alternatively, the controller circuitry 224 of FIG. 2 may be instantiated (e.g., creating an instance of, bring into being for any length of time, materialize, implement, etc.) by programmable circuitry such as a Central Processor Unit (CPU) executing first instructions. Some or all of the circuitry of FIG. 2 may, thus, be instantiated at the same or different times. Some or all of the circuitry of FIG. 2 may be instantiated, for example, in one or more threads executing concurrently on hardware or in series on hardware. Moreover, in some examples, some or all of the circuitry of FIG. 2 may be implemented by microprocessor circuitry executing instructions or FPGA circuitry performing operations to implement one or more virtual machines or containers.

Within the controller circuitry 224, the initializer circuitry 226 prepares the multiplexed ADC circuitry 108 to perform a sequence of conversions. Such initialization operations include but are not limited to receiving the setting values from the client device 110, writing the settings values to the memory 234 using the format described below, resetting internal parameters used by the sequencer circuitry 228, etc. In some examples, the initializer circuitry 226 is instantiated by programmable circuitry executing initializer instructions to perform operations such as those represented by the flowchart(s) of FIGS. 10 and 11.

Once initialization is complete, the sequencer circuitry 228 executes a sequence of operations. The sequence of operations include but are not limited to instructing the ADC circuitry 236 to perform one or more conversions using one or more settings values stored in the memory 234. In some examples, the sequencer circuitry 228 is instantiated by programmable circuitry executing sequencer instructions to perform operations such as those represented by the flowchart(s) of FIGS. 10 and 11.

The monitor circuitry 230 reports the status of the sequence of operations to the client device 110 via the interface circuitry 222. The information provided to the client device 110 may include, but is not limited to, when a conversion is completed, how many conversions have been completed, which group of setting values are used by the ADC circuitry 236 to perform the operations, etc. The monitor circuitry 230 reports the status based in part on the Data Ready (DRDY) signal generated by the ADC circuitry 236 and described further in connection with FIG. 4. In some examples, the monitor circuitry 230 is instantiated by programmable circuitry executing monitor instructions to perform operations such as those represented by the flowchart(s) of FIGS. 10 and 11.

The memory 234 stores data used by the other components of the multiplexed ADC circuitry 108 to perform operations. For example, the memory 234 stores the various settings values provided by the client device 110, as well as general settings that the sequencer circuitry 228 uses to perform a sequence of operations. The memory 234 may be implemented as any type of memory. For example, the memory 234 may be a volatile memory or a non-volatile memory. The volatile memory may be implemented by Synchronous Dynamic Random Access Memory (SDRAM), Dynamic Random Access Memory (DRAM), and/or any other type of RAM device. The non-volatile memory may be implemented by flash memory and/or any other desired type of memory device. The structure of the memory is described further in connection with FIG. 3.

The sequencer circuitry 228 enables the client device 110 to provide a greater number of instructions in a single setting than other multiplexed ADC circuits. For example, suppose the analog voltage sources 102 include eight channels having indices 1-8, and the memory 234 includes one group of settings values per channel. Suppose further that the client device 110 wants the ADC circuitry 236 to provide digital values responsive to channel 2, then responsive to channel 7, then channel 1, channel 5, and finally channel 8 (annotated as 2-7-1-5-8). Because other multiplexed ADC circuits do not support arbitrary orders, such a device can only be programmed to measure the selected channels in the order of their index (e.g., 1-2-5-7-8). To measure the channels in the desired order, a client device connected to such an existing ADC would need to send separate instructions in real time. For example, a client device connected to the ADC may send an instruction "provide channel 2 output" when the ADC is measuring channel 2, wait and send no instructions while the ADC measures channels 3 through 6, send an instruction "provide channel 7 output" when the ADC is measuring channel 7, etc. The foregoing technique is a slow procedure that may be unable to support a variety of high-speed applications.

In contrast, the example multiplexed ADC circuitry 108 of FIG. 2 allow the client device 110 to, before the ADC circuitry 236 performs any conversions, provide settings values for any number of the eight channels, indicate that channels 3, 4, and 6 are to be skipped for the subsequent operations, and indicate the remaining channels are to be performed in the sequence 2-7-1-5-8. During run time, the sequencer circuitry 228 instructs the ADC circuitry 236 to perform conversions on the second channel (e.g., analog voltage source 102-1) using the second settings values, stops the ADC when said conversions are complete, instructs the ADC start to perform conversions on the seventh channel (e.g., analog voltage source 102-7) using the seventh settings values, etc., without consulting the client device 110 for additional instructions. As a result, the multiplexed ADC circuitry 108 described herein provides greater flexibility to the client device 110 and supports a wider variety of use cases than other ADCs.

As used above and herein, run time refers to a period where the ADC circuitry 236 performs conversion operations responsive to instructions from the controller circuitry 224. Accordingly, run time begins when the controller circuitry 224 instructs the ADC circuitry 236 to begin conversion operations and run time ends when the controller circuitry 224 instructs the ADC circuitry 236 to stop conversion operations.

Notably, the multiplexed ADC circuitry 108 includes more flexibility beyond the indexed order and one-to-one correspondence of inputs and settings values described in the foregoing example. Instead, the sequencer circuitry 228 may have implemented the order of input channels 2-7-1-5-8 by using a first group of settings values that refer to input channel 2, skipping a second group of settings values that refer to a different input channel, using a third group of settings values that refer to input channel 7, etc. Moreover, the sequencer circuitry 228 could also have two groups of settings values that have the same channel input but different values for other settings (e.g., gain, enable, etc.). The settings values stored in the group are described further in connection with FIG. 9.

Figure 3:
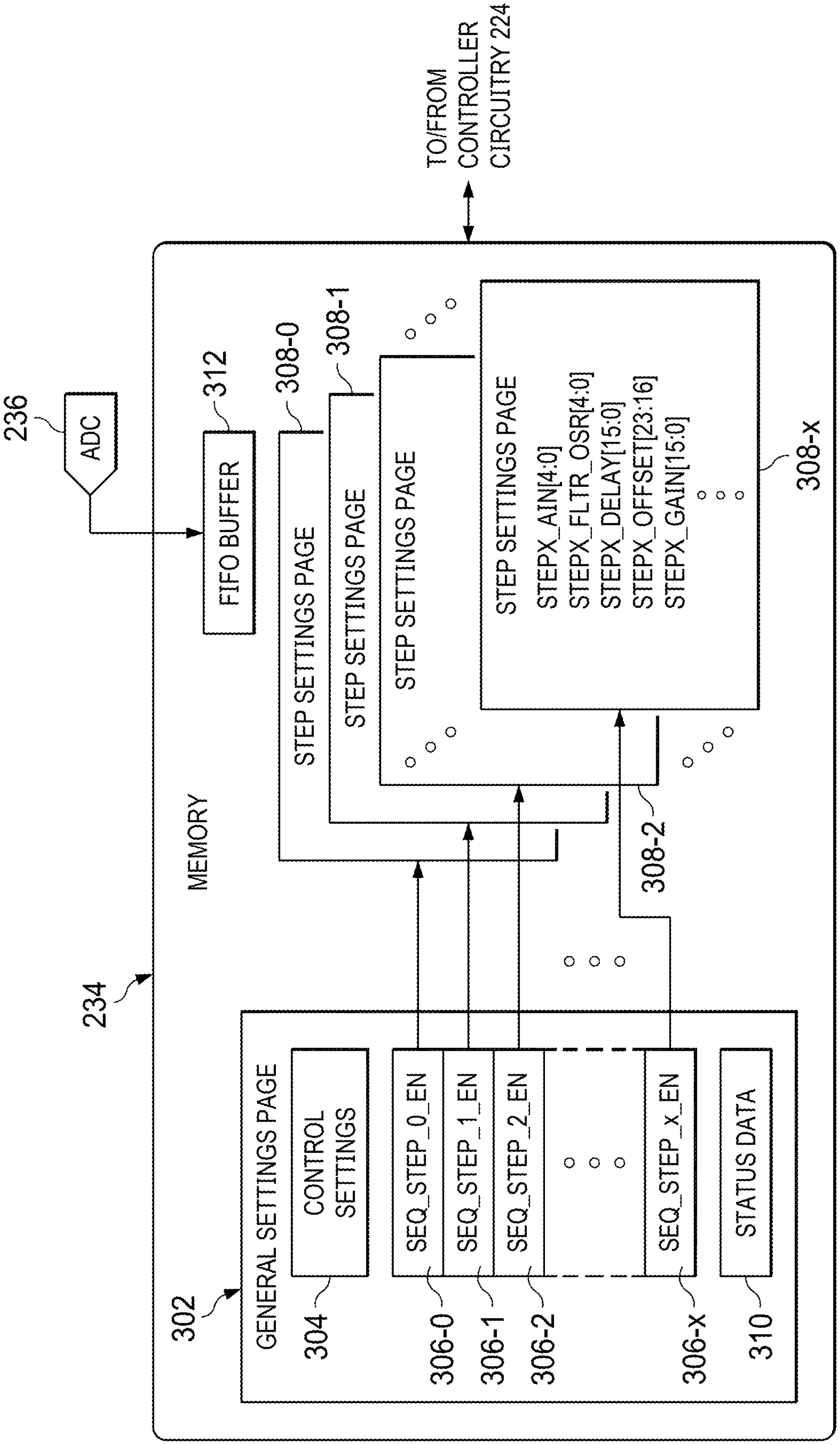
FIG. 3 is a block diagram of an example implementation of the memory of FIG. 2.

FIG. 3 is a block diagram of an example implementation of the memory of FIG. 1. The memory 234 includes an example general settings page 302, example step settings pages 308-0, 308-1, 308-2, . . . , **308-*x* (collectively referred to as step settings pages 308), example status data 310, and an example First In First Out (FIFO) buffer 312. The general settings pages 302 include example control settings 304 and example enable bits 306-0, 306-1, 306-2, . . . , 306-*x* (collectively referred to as enable bits 306**).

In examples described herein, a page refers to a fixed continuous section of virtual addresses within the memory 234. Accordingly, the controller circuitry 224 can access all the data on a given page by reading or writing from the continuous range of virtual addresses despite the physical location for said data being spread out in disparate sections of the memory 234. In some examples, the multiplexed ADC circuitry 108 includes memory controller circuitry that stores and updates a mapping between virtual addresses and physical addresses. In other examples, the data on the general settings page 302 and the step settings pages 308 are stored in a different format within the memory 234.

Within the general settings page 302, the control settings 304 refers to data that defines a sequence. The control settings 304 are populated before run time by the initializer circuitry 226 performing write operation responsive to the settings values provided by the client device 110. The sequencer circuitry 228 then reads the control settings 304 to determine when and where to start a sequence, when to stop a sequence, etc. The control settings are described further in connection with FIG. 4.

The enable bits 306 refer to a sequence of bits within the general settings page 302 that correspond to the step settings page 308. In examples described herein, there is one enable bit **306-*x* per step settings page 308-*x*, where x may be any positive integer. A given step settings page 308-0 is considered enabled when the corresponding enable bit 306-0 is set to a first logical value (e.g., a 1). Conversely, the step settings page is considered disabled when the corresponding enable bit 306-0** is set to a different logical value (e.g., a 0).

The control settings 304 are populated before run time by the initializer circuitry 226 performing write operation responsive to the settings values provided by the client device 110. The sequencer circuitry 228 then reads the enable bits 306 to determine which step settings pages 308 to include in the sequence. In some examples, the enable bits 306 are referred to as part of the control settings 304 because the enable bits 306 help to define a sequence.

The step settings pages 308 store values of settings that affect the conversion operations of the ADC circuitry 236. Such settings include but are not limited to STEPX_AIN, STEPX_FILTR_OSR, STEPX_DELAY, STEPX_OFFSET, STEPXGAIN, as shown on step settings page **308-*x* and described further below in connection with FIG. 9. The step settings pages include x pages of the memory 234 so that step settings page 308-0 may store STEPX_AIN=a first value, while step settings page 308-1** stores STEPX_AIN=a second value, etc., for each of the settings represented on the pages.

The flexibility of the step settings pages 308 allows the client device 110 to provide x many unique combinations of settings values (thereby providing instructions for the ADC circuitry 236 to create digital values x different ways) before the ADC circuitry 236 begins any conversion operations at run time. The step settings pages 308 also include a NUM_CONV setting that defines how many conversions the ADC circuitry 236 performs on the current step settings page. Accordingly, the ADC circuitry 236 can perform x(NUM_CONV) unique conversions before requiring additional instructions that describe different conversions. Furthermore, in some modes, the ADC circuitry 236 repeatedly executes one or more of the x(NUM_CONV) conversions in a loop without requiring additional instructions from the client device 110. In some examples, x=32 and NUM_CONV has a maximum value of 512, so a single sequence can include up to 32 (512)=16,384 different conversions from analog inputs to digital values. A designer or manufacturer of the ADC circuitry 236 may select a value for x and a maximum limit of NUM_CONV responsive to the size of the memory 234. As such, the multiplexed ADC circuitry 108 allows the client device 110 to provide a greater number of instructions before run time than other ADCs. The multiplexed ADC circuitry 108 also supports greater flexibility within those instructions than other ADCs.

To perform operations in high-speed environments (including but not limited to the diagnostic and process quantity measurements described above), the client device 110 requires both a high-speed ADC and an understanding of which digital values correspond to the various settings provided before run time. Accordingly, the status data 310 refers to parameters that describe the current status of the sequence. For example, the status data 310 includes but is not limited to which of the step settings pages 308 is currently being used by the ADC circuitry 236 and how many conversions have been completed using the current step settings page 308-*x*. In some examples, the status data 310 is referred to as a sequence status register. The parameters within the status data 310 are described further below in connection with FIGS. 7 and 8.

The sequencer circuitry 228 repeatedly updates the status data 310 during the sequence of operations. The monitor circuitry 230 also repeatedly reads from the status data 310 and includes the status data in outgoing messages to the client device 110. In some examples, the monitor circuitry 230 regularly adds the status data to a status header within SPI frames that are transmitted to the client device 110. In such examples, the interface circuitry 222 constructs the body of the SPI frame to include a number of digital values produced by the ADC circuitry 236. In other examples, the monitor circuitry 230 provides the status data and the ADC circuitry 236 provides the digital values to the client device in a different format.

The FIFO buffer 312 temporarily stores digital values that are produced by the ADC circuitry 236. The FIFO buffer 312 stores the digital values until the controller circuitry 224 packages the data into the body of a SPI frame as described above. The controller circuitry 224 removes digital values from the FIFO buffer 312 in chronological order. Accordingly, the controller circuitry 224 does not remove a digital value from time T before a digital value from time T−1. The FIFO buffer 312 is described further in connection with FIG. 7.

FIG. 4 is an example implementation of the control settings described in FIG. 3. FIG. 4 shows that the control settings 304 include an example PAGE_POINTER field 402, an example PAGE_INDICATOR field 404, an example SEQ_MODE field 406, the enable bits 306, an example STEP_INIT field 410, an example START bit 412, an example STOP bit 414, an example STOP_BEHAVIOR field 416, and an example DRDY_CFG field 418.

The PAGE_POINTER field 402 stores an address that corresponds to one of the x step settings pages 308 (e.g., step settings page 308-0). Before run time, any read or write operations performed by the initialization circuitry 226 occur on the step page settings page 308-0 referred to by the PAGE_POINTER field 402. Accordingly, the step settings page described in the PAGE_POINTER field 402 may be referred to as the active page during the initialization period.

The PAGE_INDICATOR field 404 also describes the active page during the initialization period. However, while the PAGE_POINTER field 402 is a writeable register, the PAGE_INDICATOR field 404 is read-only. The two fields are implemented separately to increase robustness. In the example of FIG. 4, both the PAGE_POINTER field 402 and PAGE_INDICATOR field 404 are eight bits wide having indices [7:0].

The SEQ_MODE field 406 indicates a mode for the sequencer circuitry 228. The SEQ_MODE field 406 includes two bits (labelled [1:0]) to describe one of four different modes that the sequencer circuitry may operate in. The four modes are described further in connection with FIG. 5.

The enable bits 306, as described above, refer to one bit per step settings page that describe whether said step settings page is enabled or disabled. In the example of FIG. 4, the enable bits 306 are considered part of the control settings 304 and labeled SEQ_STEP_x_EN, where x is the index of the step settings page. In the example of FIG. 4, x=32. More generally, a manufacturer of designer may choose any number of step settings pages and corresponding enable bits responsive to the amount of memory 234 implemented within the multiplexed ADC circuitry 108.

The STEP_INIT field 410 identifies the particular step setting page 308 that starts the sequence. For example, suppose again that if step settings pages 308-3, 308-7, 308-19, and 308-21 are enabled. Setting STEP_INIT field 410 to point to page 308-3 would cause a single sequence to be with step settings page 308-3 first, then 308-7, then 308-19, and finally 308-21 (annotated as [3, 7, 19, 21]). Alternatively, if the same settings pages are enabled but the STEP_INIT field 410 instead points to page 308-7, then a single sequence would be defined as [7, 19, 21, 3]. In the example of FIG. 4, the STEP_INIT field 410 uses five bits (labelled as [4:0]) to store the index of the setting page because 2^5=x=32. In other examples, the STEP_INIT field 410 uses a different number of bits or identifies a setting page using a different technique.

The START bit 412 refers to a bit in the memory 234 that, when set to a specific logical state (e.g., a logical 1), triggers the sequencer circuitry 228 to start the sequence. Accordingly, the initialization circuitry 226 sets the START bit 412 to a logical 1 after the initialization period has ended. Also, setting the START bit 412 to a logical 1 while the sequencer is running aborts the ongoing sequence run and restarts a new sequence run from the beginning. The client device 110 may choose to abort and restart a sequence for any reason (e.g., one of the analog voltage sources 102 was not properly initialized and generating noise during run time instead of data). Setting the START bit 412 while the multiplexed ADC circuitry 108 is in a power down mode, however, does not trigger the sequencer circuitry 228 to start a sequence.

In some examples, as an alternative to using the START bit 412 and STOP bit 414, the interface circuitry 222 includes a dedicated START pin that can be used to control starts and stops of the sequencer circuitry 228. In such examples, the functionality of the START pin functionality is enabled by setting GPIO0_CFG bits in the memory 234 to the values 11. The GPIO0_CFG bits default to values 00 at power-up, so operations of the START pin are available after initializing the multiplexed ADC circuitry 108. A rising edge on the START pin is equivalent to writing to the START bit 412, while a falling edge on the START pin is equivalent to writing to the STOP bit 414.

The STOP bit 414 refers to a bit in the memory 234 that triggers the sequencer circuitry 228 to stop the sequence when set to a specific logical state. In examples described herein, the sequencer circuitry 228 is triggered to stop in response to the STOP bit 414 being set to a logical 1. The client device 110 determines the value of the STOP bit 414 by sending instructions via the interface circuitry 222. The client device 110 can use the STOP bit 414 to: a) provide an external stop condition for the single step continuous mode or the continuous sequence mode, or b) abort the execution of the single shot mode or the single sequence mode before they would otherwise complete.

The STOP_BEHAVIOR field 416 describes how the sequencer circuitry 228 is triggered after the STOP bit 414 is set to a logical 1. For example, the STOP_BEHAVIOR field 416 whether the sequencer circuitry 228 stops immediately or after a certain number of operations. As described further in connection with FIG. 6, the sequencer circuitry 228 interprets both the two bits in the STOP_BEHAVIOR field 416 and the two bits in the SEQ_MODE field 406 to determine when to stop operations.

The DRDY_CFG field 418 describes how the sequencer circuitry 228 uses a data ready (DRDY) signal. In examples where the multiplexed ADC circuitry 108 implements the SPI protocol, the DRDY signal indicates when a certain number of conversions are complete and ready to be read by the client device 110. If the client device 110 does not wait for a DRDY signal, the client device 110 may inadvertently read data from a previous conversion. In examples that do not use the SPI protocol, a different technique is implemented to inform the client device 110 when conversions are complete.

The DRDY_CFG field 418 includes two bits that describe one of four possible modes. In the first mode, the sequencer circuitry 228 provides conversion data in a SPI frame in response to the DRDY signal indicating that the ADC circuitry 236 has completed a single conversion. In the second mode, the sequencer circuitry 228 provides conversion data in a SPI frame in response to the DRDY signal indicating the ADC circuitry 236 has completed a step settings page. In the third mode, the sequencer circuitry 228 provides conversion data in a SPI frame in response to the DRDY signal indicating the ADC circuitry 236 has completed an iteration of a sequence. In the fourth mode, the sequencer circuitry 228 provides conversion data in a SPI frame in response to the DRDY signal indicating the ADC circuitry 236 has completed storing a threshold number of conversions. The FIFO buffer threshold is described further in connection with FIG. 8.

FIG. 5 is an example implementation of the SEQ_MODE field 406 of FIG. 4. At any point in time, the two bits in the SEQ_MODE field 406 may store the bits1 00, 01, 10, or 11.

If the SEQ_MODE field 406 stores bits 00, then the client device 110 has selected single-shot mode. In single-shot mode, the sequencer circuitry 228 executes a single step settings page one time before stopping. As used herein, executing a step settings page includes but is not limited to loading settings from the page into the ADC circuitry 236, then instructing the ADC circuitry 236 to perform a specific number of conversions. Execution of a step settings page is described further in connection with FIG. 11.

Alternatively, if the SEQ_MODE field 406 stores bits 01, then the client device 110 has selected single step continuous mode. In single step continuous mode, the sequencer circuitry 228 repeatedly executes a single setting page (defined by the STEP_INIT field 410) until receiving an external stop command. The external stop command is provided by the client device 110 using the STOP bit 414 and the STOP_BEHAVIOR field 416 as described further in FIG. 6.

In examples described herein, a sequence is referred to the execution of two or more step settings pages (as defined by the enable bits 306) without intermittent instructions from the client device 110. In such examples, neither the single shot mode nor the single step continuous mode is considered a sequence because, in such modes, the sequencer circuitry 228 executes only a single step settings page. In other examples, a sequence refers to any execution of a step settings page by the sequencer circuitry 228.

In a third example, if the SEQ_MODE field 406 stores bits 10, then the client device 110 has selected single sequence mode. Single sequence mode indicates that: a) any number of the step settings pages 308 may be enabled and b) the sequencer circuitry 228 executes the enabled step settings pages 308 once before stopping. The sequencer circuitry 228 skips any disabled step settings pages 308 in single sequence mode.

Finally, if the SEQ_MODE field 406 stores bits 11, then continuous sequence mode is selected. In continuous sequence mode, a) any number of the step settings pages may be enabled and b) the sequencer circuitry 228 repeatedly executes the enabled step settings pages (and skips the disabled step settings pages) until receiving an external stop command. The four sequencer modes are described further below in connection with FIG. 11.

FIG. 6 is an example implementation of the STOP_BEHAVIOR field 416 described in FIG. 4. FIG. 6 shows possible entries for the STOP_BEHAVIOR field 416 as rows and shows possible entries for the SEQ_MODE field 406 as columns because both settings influence when the multiplexed ADC circuitry 108 stops performing operations. After stopping, the multiplexed ADC circuitry 108 requires additional instructions from the client device 110 to perform additional conversions. The sequencer circuitry 228 performs one of the stop conditions described in FIG. 6 in response to the client device 110 setting the STOP bit 414 to a logical 1.

FIG. 6 shows that, regardless of which sequencer mode the SEQ_MODE field 406 describes, the sequencer circuitry 228 stops performing operations immediately in response to the STOP bit 414=1 and the STOP_BEHAVIOR field 416=00. In some examples, stopping immediately may cause the ADC circuitry 236 to stop in the middle of a conversion operation. Accordingly, the client device 110 may reserve the use of 00 in the STOP_BEHAVIOR field 416 for emergency conditions.

In many examples, the client device 110 waits to stop operations until the ADC circuitry 236 completes the current conversion from an analog input to a digital value. Such examples include: a) when the SEQ_MODE field 416=00 (single shot mode) and STOP_BEHAVIOR field 416=01, b) when the SEQ_MODE field 416=01 (single step continuous mode) and STOP_BEHAVIOR field 416=01, 10, or 11, or c) when the SEQ_MODE field 416=10 or 11 (single sequence or continuous sequence modes) and STOP_BEHAVIOR field 416=01. Such an option prevents the ADC circuitry 236 from wasting computer resources on an unfinished conversion operation.

In some examples, the client device 110 waits to stop operations until the ADC circuitry 236 has completed all of the conversions within the current step settings page 308-*x*. Such examples include a) when the SEQ_MODE field 416=00 (single shot mode) and STOP_BEHAVIOR field 416=10 or 11, and b) when the SEQ_MODE field 416=11 (continuous sequence mode) and STOP_BEHAVIOR field 416=10. Because a first step settings page 308-0 may describe a different number of conversion operations than a second step settings page 308-1, the number of conversion operations remaining after the STOP bit 414 is set to a logical 1 in the foregoing mode is responsive to the current step settings page.

In some examples, the client device 110 waits to stop operations until the ADC circuitry 236 has completed all of the conversions within the current iteration of the sequence. As used above and herein, an iteration of a sequence refers to one execution of all the step settings pages 308 that are currently enabled. Thus, an iteration of a sequence has a maximum of x page executions, where x is the number of step settings pages 308. As an example, single sequence mode (SEQ_MODE 406=10) refers to a single iteration of a sequence, while continuous sequence mode (SEQ_MODE 106=11) may refer to any number of iterations of the same sequence. Therefore, the number of conversion remaining after the STOP bit 414 is set to a logical 1 in the foregoing mode is responsive to the enable bits 306 (which store the current sequence definition).

FIG. 7 is an example implementation of first parameters in the status data of FIG. 3. The status data 310 includes an example SEQ_ACTIVE field 702, an example SEQ_COUNT field 704, an example STEP_INDICATOR field 706, and an example CONV_COUNT field 708. During runtime, the monitor circuitry 230 updates the status data 310 responsive to the ADC circuitry 236 completing a conversion. The monitor circuitry 230 determines a conversion has been completed by checking the DRDY signal transmitted from the ADC circuitry 236.

The SEQ_ACTIVE field 702 describes if the sequencer circuitry 228 is active. The sequencer circuitry 228 is considered active when the START bit 412 is set to a logical 1 and the sequencer circuitry 228 is operating in any of the sequencer modes described in FIG. 5.

The SEQ_COUNT field 704 describes the number of sequence iterations that the sequencer circuitry 2228 has completed execution of. Accordingly, the monitor circuitry 230 updates the SEQ_COUNT field 704 during continuous sequence mode (SEQ_MODE 406=11). In the example of FIG. 7, the SEQ_COUNT field 704 is implemented as four bits (labeled [3:0]). In other examples, the SEQ_COUNT field 704 is implemented with a different number of bits. In some examples, the SEQ_COUNT field 704 is referred to as an iteration counter or a sequence counter.

The STEP_INDICATOR field 706 indicates the index of the current step settings page. Accordingly, the monitor circuitry 230 updates the SEQ_COUNT field 704 during single sequence mode and continuous sequence mode (SEQ_MODE 406=10 or 11). In some examples, the STEP_INDICATOR field 706 is referred to as a step counter.

The CONV_COUNT field 708 indicates the number of conversions completed by the ADC circuitry 236 using the current settings values from the current step settings page. Accordingly, the monitor circuitry 230 increments the CONV_COUNT field 708 throughout execution of an enabled step settings page 308-0 and resets the CONV_COUNT field 708 at the start of the next enabled step settings page 308-1. In some examples, the CONV_COUNT field 708 is referred to as a conversion counter.

FIG. 8 is an example implementation of second parameters in the status data of FIG. 3. In addition to the parameters from FIG. 7, the status data 310 also includes example threshold settings 802 and 804. The monitor circuitry 230 updates the DRDY signal responsive to one of the conditions described in either the threshold settings 802 or 804.

The threshold settings 802 and 804 both reference two different thresholds relating to the FIFO buffer 312. The first threshold value, FIFO_THRES_A, refers to one edge of the DRDY signal while the second threshold, FIFO_THRES_B, refers to the other edge of the DRDY signal. The threshold setting 802 refers to conditions where FIFO_THRES_A is greater or equal to FIFO_THRES_B. In contrast, the threshold setting 804 refers to conditions where FIFO_THRES_A is less than FIFO_THRES_B. The status data 310 includes two separate FIFO thresholds so that the rising and falling edge of the DRDY signal occur at two different conditions.

The depth of the FIFO buffer 312 (labelled FIFO_DEPTH in FIG. 8) refers to the number of digital values that are currently stored in the FIFO buffer 312. In the threshold settings 802, the FIFO_DEPTH may be: a) greater than both FIFO thresholds, or b) less than both FIFO thresholds. The threshold settings 802 does not contain a condition where FIFO_DEPTH is less than FIFO_THRES_A and greater than FIFO_THRES_B because, in such conditions, the DRDY signal is not updated and instead remains stable at its previous value. Similarly, in the threshold settings 804, the FIFO_DEPTH may be: a) greater than both FIFO thresholds, or b) less than both FIFO thresholds.

FIG. 8 indicates that the monitor circuitry 230 updates the DRDY signal at falling edges when: a) FIFO_THRES_A≥FIFO_THRES_B and FIFO_DEPTH>FIFO_THRES_A, or b) FIFO_THRES_A<FIFO_THRES_B and FIFO_DEPTH>FIFO_THRES_B. Accordingly, the monitor circuitry 230 indicates another conversion is ready for the client device 110 to use by transmitting a transition from a logical 1 to a logical 0 in the DRDY signal.

Conversely, FIG. 8 indicates that the monitor circuitry 230 updates the DRDY signal at the rising edges when: a) FIFO_THRES_A≥FIFO_THRES_B and FIFO_DEPTH≤FIFO_THRES_B, or b) FIFO_THRES_A<FIFO_THRES_B and FIFO_DEPTH≤FIFO_THRES_A.

FIG. 9 is an example implementation of a step settings page 308-*x* as described in FIG. 3. The step settings page 308-*x* includes an example STEPx_AINP field 902, an example STEPx_AINN field 904, an example STEPx_EXT_RNG field 906, an example STEPx_REF_SEL field 908, an example CODING field 910, an example STEPx_NUM_CONV field 912, an example STEPx_FLTR_OSR field 914, an example STEPx_FLTR_MODE field 916, an example STEPx_DELAY_MSB field 918, an example STEPx_OFFSET field 920, and an example an example STEPx_GAIN field 922.

As described above, the step settings pages 308 store different values for the same group of settings that influence the conversion operations of the ADC circuitry 236. For example, a STEP0_AINP field is stored on step settings page 308-0, a STEP1_AINP field is stored on step settings page 308-1, etc., across all step settings pages 308 and all fields shown in FIG. 9.

The STEPx_AINP field 902 selects which of the analog inputs 102 is used as the positive analog input to the ADC circuitry 236 during execution of the step settings page 308-*x*. Similarly, the STEPx_AINN field 904 selects which of the analog inputs 102 is used as the negative analog input to the ADC circuitry 236 during execution of the step settings page 308-*x*. The step settings page 308-*x* includes two separate input selection fields because, in examples described herein, the multiplexed ADC circuitry 108 supports differential signaling. In other examples where the multiplexed ADC circuitry 108 supports single-ended signaling, the step settings page 308-*x* includes a single input selection field.

The STEPx_EXT_RNG field 906 describes a range of voltage values that are acceptable for use as external reference voltages during execution of the step settings page 308-*x*. Because the multiplexed ADC circuitry 108 may be implemented in a wide variety of use cases, the REFP and REFN values provided by the voltage reference circuitry 104 may be voltages of any magnitude. By providing a value for the STEPx_EXT_RNG field 906 before run time, the client device 110 can define a range of voltages that both keeps the ADC circuitry 236 operating safely and meets the particular needs of the present use case.

The STEPx_REF_SEL field 908 describes whether the ADC circuitry 236 performs comparisons using an external or internal reference voltages (from the voltage reference circuitry 214) or external reference voltages (from the voltage reference circuitry 104) during execution of the step settings page 308-*x*. The control device 110 may choose an external or internal reference voltage for any reason, including but not limited to the range of possible voltage values that the various circuits can provide. In examples where the STEPx_REF_SEL field 908 stores a selection of internal reference voltages, the sequencer circuitry 228 does not refer to the STEPx_EXT_RNG field 906 when executing the step settings page 308-*x*.

The client device 110 provides a value for the CODING field 910 to select a conversion data coding format. In general, the conversion operations performed by the ADC circuitry 236 refer to the mapping of an input voltage to an output voltage, where the input voltage may be anywhere in a continuous range of values (e.g., an analog input) and the output voltage is one of a discrete set of choices (e.g., a digital value). In the example of FIG. 9, the CODING field 910 describes a selection of either: a) a binary two's complement format where the Most Significant Bit (MSB) is the sign bit, or a unipolar straight binary format. In other examples, the CODING field 910 describes one or more different coding schemes.

The STEPx_NUM_CONV field 912 describes the number of conversion operations performed by the ADC circuitry 236 during execution of the step settings page 308-*x*. For example, if STEPx_NUM_CONV field 912=100, then the ADC circuitry 236 samples the inputs from the STEPx_AINP field 902 and STEPx_AINN field 904 100 times and produces 100 corresponding digital values during step settings page 308-*x*. More generally, the ADC circuitry 236 uses all of the setting values from step settings page 308-*x* to perform the number of conversions described in STEPx_NUM_CONV field 912. In the example of FIG. 9, the STEPx_NUM_CONV field 912 is implemented using four bits (labeled [3:0]) and the maximum value of the STEPx_NUM_CONV field 912 in the example of FIG. 9 is 512.

The STEPx_FLTR_OSR field 914 refers to a selection of the Over Sampling Rate (OSR) of the digital filter operations performed by the ADC circuitry 236. The signals provided by the analog inputs 102 to the ADC circuitry 236 have both a magnitude and a frequency. In general, the ADC circuitry 236 preserves the magnitude information when performing conversion operations but does not preserve the frequency. The shift in frequency information, known as signal aliasing, can introduce noise into the digital output value if left unattended.

The ADC circuitry 236 applies a digital filter to counteract signal aliasing and reduce system noise. To perform digital filtering, the ADC circuitry 236 is generally required to sample the analog input at a rate greater or equal to the Nyquist frequency (which in turn is two times the maximum frequency in the usable bandwidth of the signal). In general, increasing OSR requires additional power consumption but helps improve the Signal to Noise Ratio (SNR) of the output. Before run time, the client device 110 can specify the frequency at which the ADC circuitry 236 performs oversampling specific during execution of the step settings page 308-*x*.

In the example of FIG. 9, the ADC circuitry 236 applies the digital filter using either SINC3 mode or SINC4 mode. In SINC3 mode, the ADC circuitry 236 applies a low pass filter to remove high frequency components above a cut-off frequency defined by sinc(x)ˆ3=0. Similarly, in SINC4 mode, the ADC circuitry 236 applies a low pass filter where the cut-off frequency is defined by sinc(x)ˆ4=0. In general, application of the SINC4 filter results in less noise than the SINC3 filter. However, the SINC4 requires additional settling to use than the SINC3 filter. Before run time, the client device 110 can use the STEPx_FLTR_MODE field 916 to select which of SINC3 or SINC4 filters best supports the present use case. In other examples, the ADC circuitry 236 applies a digital filter using a different protocol.

In some examples, the foregoing digital filter operations are performed by a different component (other than the ADC circuitry 236) within the multiplexed ADC circuitry 108. In such examples, the digital filtering still occurs after the initial digital value is produced but before a final digital value is provided to the client device 110.

The STEPx_DELAY_MSB field 918 quantifies the magnitude of a programmable delay. Before instructing the ADC circuitry 236 to begin performing the number of conversions described in the STEPx_NUM_CONV field 912, the sequencer circuitry 228 firsts waits an amount of time described in the STEPx_DELAY_MSB field 918. The client device 110 can populate the STEPx_NUM_CONV field with nonzero values to provide a gap in time between receiving digital values of a first enabled step settings page and a receiving digital values of a second enabled step settings page. During the gap in time, the client device 110 may perform any type of operations to prepare for one or more changes in setting values (e.g., implement a function, launch a software program, transmit a message, etc.)

The STEPx_DELAY_MSB field 918 may refer to any amount of time, including zero seconds. In the example of FIG. 9, the STEPx_DELAY_MSB field 918 is stored in eight bits (labeled [7:0]). In other examples, the STEPx_DELAY_MSB field 918 is stored in a different number of bits.

The STEPx_OFFSET field 920 quantifies the offset value used by the ADC circuitry 236 during execution of the step settings page 308-*x*. Accurate operation of an ADC requires the mapping between the analog input voltage to digital output to be: a) static, and b) consistent with the mapping description provided. However, in some examples, internal mismatch between components of an ADC can cause the actual mapping to deviate from the idealized mapping. In some examples, the mapping between the analog input voltage to digital output is referred to as the transfer function of an ADC.

The ADC circuitry 236 adds an offset voltage, defined by STEPx_OFFSET field 920 to its digital values. The applied offset shifts the transfer function of the ADC circuitry 236, thereby causing the first transition between discrete output voltages to occur at the expected input voltage. In some examples, the client device 110 stores an offset voltage responsive to the full-scale voltage exhibited by the selected inputs in the STEPx_AINP field 902 and the STEPx_AINN field 904. In the example of FIG. 9, the STEPx_OFFSET field 920 is stored in twenty-four bits (labeled [23:0]). In other examples, the STEPx_OFFSET field 920 is stored in a different number of bits.

While applying an offset voltage corrects the first transition from between discrete output voltages (e.g., between digital values 000 and 001), the offset does not by itself guarantee that the other transitions (e.g., between digital values 001 and 010, between 010 and 011, etc.) are properly aligned with the idealized transfer function of an ADC. To correct the other errors that may be present throughout the range of possible input voltages, the ADC circuitry 236 multiplies a gain value to the sum of the digital value and the offset voltage. The gain value scales the magnitude of the output voltage responsive to the magnitude of the input voltage, thereby restoring the transfer function to the expected mapping between analog input and digital outputs. The sequencer circuitry 228 determines the magnitude of the gain responsive to the value in the STEPx_GAIN field 922. In the example of FIG. 9, the STEPx_GAIN field 922 is stored in sixteen bits (labeled [15:0]). In other examples, the STEPx_GAIN field 922 is stored in a different number of bits.

The step settings page 308-*x* may include additional or different settings than those shown in FIG. 9. In some examples, the step settings page 308-*x* includes a field that describes the value of the SW1 and SW2 signals used to open and close the switches 208 and 210 and control the power consumption of the buffer circuitry 212. In other examples (e.g., FIG. 9), the state of the switches 208 and 210 is not controlled by the step settings page 308-*x* due to the length of time required for the buffer circuitry 212 to settle.

Figure 10:
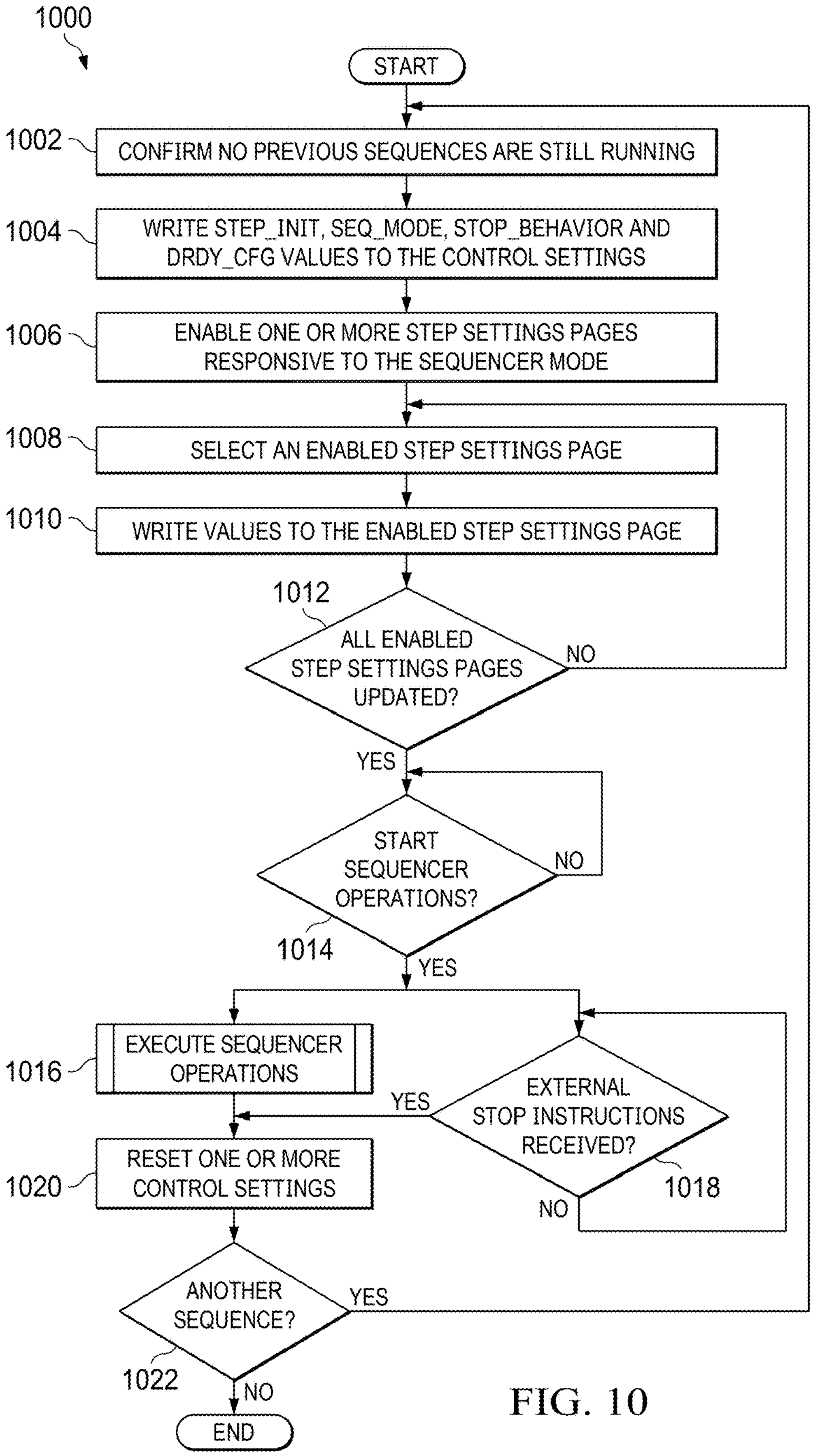
FIG. 10 is a flowchart representative of example machine-readable instructions or example operations that may be at least one of executed, instantiated, or performed using an example programmable circuitry implementation of the control circuitry of FIG. 2.

FIG. 10 is a flowchart representative of example machine-readable instructions or example operations 1000 that may be at least one of executed, instantiated, or performed by programmable circuitry to implement a sequence. The example machine-readable instructions or the example operations 1000 of FIG. 10 begin when the initializer circuitry 226 confirms that there are no previous sequences that are still running. (Block 1002). To do so, the initializer circuitry 226 reads the memory 234 to confirm that: a) the START bit 412 is set to a logical 0, b) the STOP bit 414 is set to a logical 0, and c) the SEQ_ACTIVE field 702 indicates the sequencer circuitry 228 is not currently active. If any of the START bit 412, STOP bit 414, or SEQ_ACTIVE field 702 are not in the foregoing states, then the initializer circuitry 226 may wait an amount of time for the sequencer circuitry 228 or the monitor circuitry 230 to finish performing operations associated with a previous sequence. The initializer circuitry 226 may also raise an error flag if the START bit 412, STOP bit 414, and SEQ_ACTIVE field 702 are not in the foregoing states at an expected time.

The initializer circuitry 226 writes new values for the STEP_INIT field 410, SEQ_MODE field 406, STOP_BEHAVIOR field 416, and DRDY_CFG field 418 to the control settings 304 within the general settings page 302. (Block 1004). The initializer circuitry 226 obtains the new values for the parameters of block 1004 responsive to instructions from the client device 110. The client device 110 edits the foregoing parameters before run time because, the STEP_INIT field 410, SEQ_MODE field 406, STOP_BEHAVIOR field 416, and DRDY_CFG field 418 collectively define a sequence, describe how it stops, and describe how its progress is reported.

The initializer circuitry 226 enables one or more of the step settings pages 308 responsive to the sequencer mode. (Block 1006). To enable a step settings page 308-*x*, the initializer circuitry 226 writes a logical 1 to the corresponding enable bit 306-*x* (labeled SEQ_STEP_x_EN in FIG. 3). A step settings page is considered disabled if its corresponding enable bit stores a logical 0 at the end of block 1006.

In single shot mode (SEQ_MODE field 406=00) and single step continuous mode (SEQ_MODE field 406=01), the initializer circuitry 226 may skip execution of block 1006 because the singular step settings page used in said modes is defined by the STEP_INIT field 410. In single sequence mode (SEQ_MODE field 406=10) and continuous sequence mode (SEQ_MODE field 406=11), the initializer circuitry 226 enables at least the step settings page identified in STEP_INIT field 410 and may further enable other step settings pages at block 1006.

The initializer circuitry 226 selects one of the enabled step settings pages 308. (Block 1008). The initializer circuitry 226 the writes values to the step settings page. (Block 1010). The values stored in the step settings page influence the conversion operations performed by the ADC circuitry 236 as described above in connection with FIG. 9. The initializer circuitry 226 performs the write operations of block 1010 responsive to instructions provided by the client device 110. In some examples, the write operations at block 1010 may be referred to as updating a step settings page.

The initializer circuitry 226 determines whether all of the enabled step settings pages have been updated. (Block 1012). If one or more of the enabled step settings pages still require updates (Block 1012: No), control returns to block 1008 where the initializer circuitry 226 selects another enabled step settings page that has not yet been selected in the current iteration of blocks 1002-1022.

Alternatively, if the initializer circuitry 226 determines all of the enabled step settings pages 308 have been updated (Block 1012: Yes), the sequencer circuitry 228 determines whether to start sequencer operations. (Block 1014). The sequencer circuitry 228 can perform the determination of block 1014 using any suitable technique, including but not limited to: checking whether the START bit 412 is set to a logical 1, measuring a voltage at a terminal that receives a specific START signal, etc. The value of the START bit 412 or START signal are set by the client device 110, which may start a sequence at any time or for any reason. If the client device 110 has not started the sequence (Block 1014: No), the sequencer circuitry 228 waits for a period before control loops back to block 1014 and the sequencer circuitry 228 performs another check for start instructions.

If instead the sequencer circuitry 228 does receive instructions to start (Block 1014: Yes), the sequencer circuitry 228 executes sequencer operations. (Block 1016). As used above and herein, execution of sequencer operations refers to the execution of one or more step settings pages while in any of the sequencer modes described above in FIG. 5. Block 1016 is described further in connection with FIG. 11. The monitor circuitry 230 also updates SEQ_ACTIVE field 702 after the first iteration of block 1016 to indicate one or more step settings pages are being executed. In other examples, the monitor circuitry 230 only updates the SEQ_ACTIVE field 702 when at least one iteration of a sequence has been completed (e.g., in single sequence mode or continuous sequence mode).

In some examples, the sequencer circuitry 228 exits block 1016 due to a pre-determined stop condition. For example, single shot mode and single sequence mode are defined by the sequencer circuitry 228 stopping after a set number of operations. In such examples, control proceeds to block 1020 once the pre-determined stop condition is met.

Figure 11:
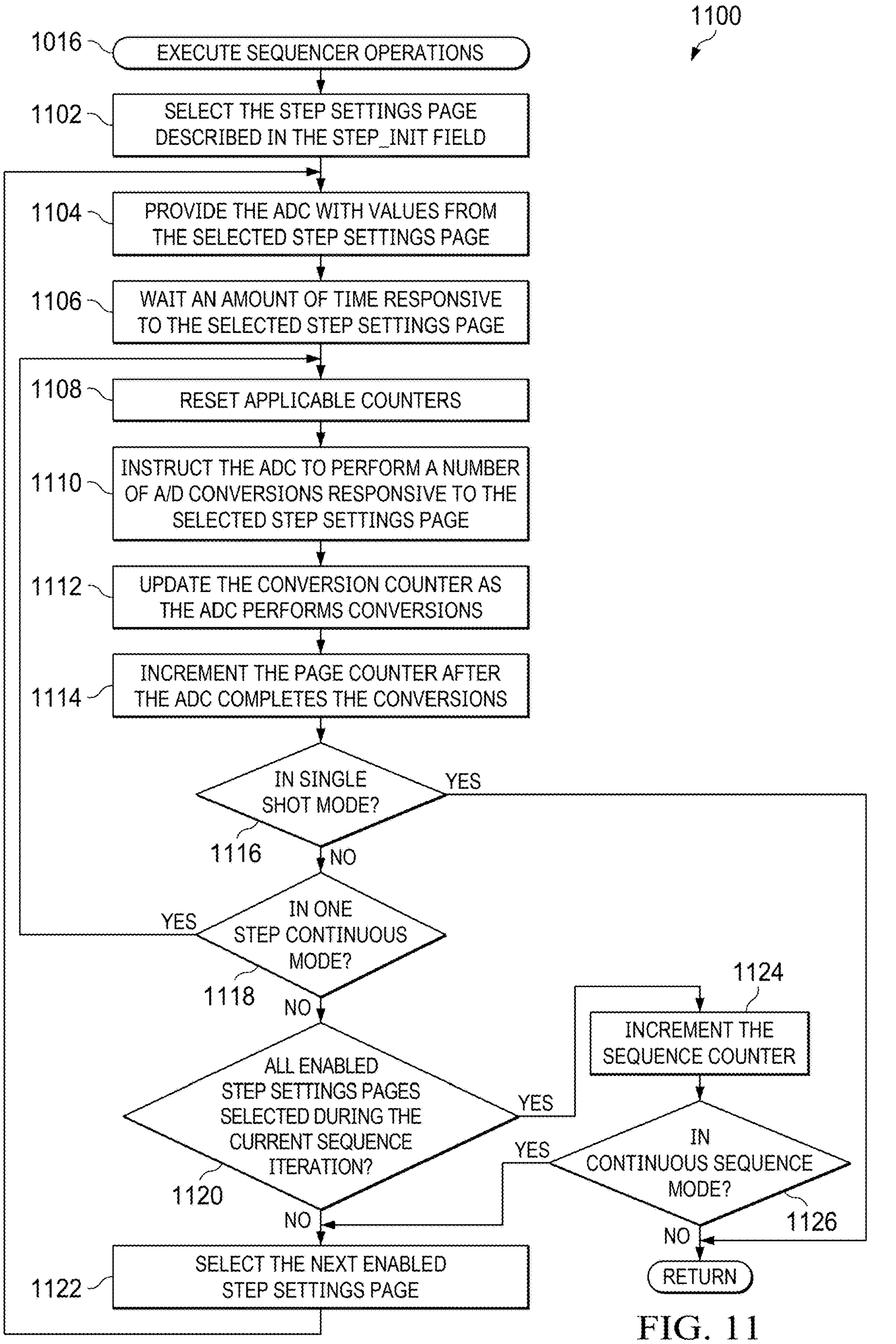
FIG. 11 is a flowchart representative of example machine-readable instructions or example operations that may be at least one of executed, instantiated, or performed to execute sequencer operations as described in FIG. 10.

In parallel with block 1016, the sequencer circuitry 228 also determines whether the client device 110 has provided external stop instructions. (Block 1018). The client device 110 may choose to stop sequencer operations at any time and for any reason. For example, the one step continuous mode and continuous sequence modes cause the sequencer circuitry 228 to execute block 1016 indefinitely until an external stop instruction is received at block 1018. In another example, the client device 110 may choose to provide a stop instruction while the sequencer circuitry 228 is in single shot mode or single sequence mode in order to terminate ADC operations before the pre-determined stop conditions would have otherwise stopped them. Accordingly, to evaluate block 1016, the sequencer circuitry 228 repeatedly checks the status of the STOP bit 414 while executing sequencer operations (e.g., while performing block 1016 in parallel) to determine if the controller circuitry 224 has received STOP instructions from the client device 110. FIG. 11 shows the repeated check of the STOP bit 414 by control looping back from (Block 1018: No) back to Block 1018.

Once the sequencer circuitry 228 ends block execution of block 1016 due to either: a) a pre-determined stop condition (which is described further in connection with FIG. 11 or b) external instructions from the client device (Block 1018: Yes), the sequencer circuitry 228 resets one or more control settings 304. (Block 1020). For example, the sequencer circuitry 228: sets the START bit 412 back to a logical 0, b) sets the STOP bit 414 back to a logical 0, and c) sets the SEQ_ACTIVE field 702 to indicate the sequencer circuitry 228 is not currently active.

The initializer circuitry 226 determines whether to perform another sequence. (Block 1022). The initializer circuitry 226 may perform additional sequences for as long as the client device 110 continues to provide new instructions after each sequence. If the initializer circuitry 226 does determine to perform another sequence (Block 1022: Yes), control returns to block 1022 where the initializer circuitry 226 confirms that no previous sequences are still running. If the initializer circuitry 226 does not receive the additional instructions required to define a new sequence (Block 1022: No), the machine-readable instructions or operations 1000 end.

In the example of FIG. 10, the machine-readable instructions or operations 1000 are implemented by various components of the controller circuitry 224. In other examples, one or more of the machine-readable instructions or operations 1000 are implemented by programmable circuitry that is implemented externally from the multiplexed ADC circuitry 108 (e.g., by a controller within the client device 110).

FIG. 11 is a flowchart representative of example machine-readable instructions or example operations that may be at least one of executed, instantiated, or performed to execute sequencer operations as described in FIG. 10. In particular, the machine-readable instructions or operations 1100 are an example implementation of block 1016 of FIG. 10.

Execution of block 1102 begins when the sequencer circuitry 228 selects the step settings page described in the STEP_INIT field 410. (Block 1102). The STEP_INIT field 410 stores a reference to the first step settings page executed by the sequencer circuitry 228 after receiving a START instruction, regardless of the sequencer mode. The STEP_INIT field 410 may refer to any of the step settings pages 308 in the memory 234.

The sequencer circuitry 228 provides the ADC circuitry 236 with values from the selected step settings page. (Block 1104). In the example of FIG. 11, the values include all of the values described above in FIG. 9 with the exception of the value stored in the STEPx_DELAY_MSB field 918. Thus, at block 1104, the sequencer circuitry 228 provides the ADC circuitry 236 with information including but not limited to: a selection of analog inputs, a selection of reference voltages, a selection of data coding, a number of conversions, digital filter settings, offset values, gain values, etc.

The sequencer circuitry 228 waits an amount of time responsive to the selected step settings page. (Block 1106). The amount of time is defined by the STEPx_DELAY_MSB field 918 stored within the selected step settings page. By implementing block 1108, the sequencer circuitry 228 introduces a programmable delay that is defined by the client device 110 and grants the client device 110 time to prepare for new digital values.

The monitor circuitry 230 resets applicable counters. (Block 1108). The counters of block 1108 refer to one or more of: the conversion counter stored in the CONV_COUNT field 708, the page counter stored in the STEP_INDICATOR field 706, and the sequence counter stored in the SEQ_COUNT field 704. The monitor circuitry 230 resets one or more of the foregoing counters from the status data 310 responsive to the status of the sequencer circuitry 228. For example, in FIG. 11, the monitor circuitry 230 resets the conversion counter to zero whenever block 1108 is executed because the conversion counter refers to the number of conversions completed in the current step settings page. The monitor circuitry 230 also resets the page counter to page zero if the current execution of block 1108 is triggered by the completion of an iteration of a sequence (e.g., one execution of all enabled step settings pages). The monitor circuitry 230 also resets the sequence counter to zero if the sequencer counter had a nonzero value (from a previous sequence) at the start of the first execution of block 1108.

After the wait period of block 1108 expires, the sequencer circuitry 228 instructs the ADC circuitry 236 to perform a number of analog to digital (A/D) conversions responsive to the selected step setting page. (Block 1110). For example, if the STEPx_NUM_CONV field 912 stored in the selected step settings page equals one hundred, then the sequencer circuitry 228 instructs the ADC circuitry 236 to perform one hundred A/D conversions at block 1110. When performing a given A/D conversions, the ADC circuitry 236 measures one of the analog inputs 102 and produces a resulting digital value using the settings provided in block 1104.

After the initial instruction to begin A/D conversions is sent at block 1110, the monitor circuitry 230 updates the CONV_COUNT field 708 as the ADC circuitry 236 performs the conversions. (Block 1112). The CONV_COUNT field 708 begins at a value of zero due to the reset at block 1108. The monitor circuitry 230 then increments CONV_COUNT field 708 responsive to the ADC circuitry 236 storing a new digital value in the FIFO buffer 312.

The monitor circuitry 230 updates the page counter after the ADC circuitry 236 completes the conversions. (Block 1114). The monitor circuitry 230 identifies a completed conversion by comparing the current value of the conversion counter to the value stored in the STEPx_NUM_CONV field 912.

The sequencer circuitry 228 determines whether it is currently operating in single shot mode. (Block 1116). In examples described herein, the sequencer circuitry 228 executes block 1116 by checking whether the SEQ_MODE field 406 in the general settings page 302 stores the bits 00. If the sequencer circuitry 228 is in single shot mode (Block 1116: Yes), control returns to block 1020 of FIG. 10 because the sequencer circuitry 228 has finished executing the single iteration of the single step setting page.

Alternatively, if the sequencer circuitry 228 is not in single shot mode (Block 1116: No), the sequencer circuitry 228 determines whether it is currently operating in one step continuous mode. (Block 1118). In examples described herein, the sequencer circuitry 228 executes block 1118 by checking whether the SEQ_MODE field 406 in the general settings page 302 stores bits 01. In the example of FIG. 10, if the sequencer circuitry 228 is in one step continuous mode (Block 1118: Yes), control returns to block 1108 where the sequencer circuitry 228 resets the conversion counter and starts a subsequent iteration of the same step settings page. In other examples, if the sequencer circuitry 228 is in one step continuous mode (Block 1118: Yes), control returns to block 1106 where the sequencer circuitry 228 waits an amount of time before starting the subsequent iteration.

If the sequencer circuitry 228 is not in one step continuous mode (Block 1118: No), the sequencer circuitry 228 determines whether all enabled step settings pages have been selected during the current sequence iteration. (Block 1120). The sequencer circuitry 228 evaluates block 1120 by comparing the page counter stored in the status data 310 to the total number of step settings pages 308 with an enabled bit set to a logical 1.

If one or more enabled step settings page has not yet been selected in the current sequence iteration (Block 1120: No), the sequencer circuitry 228 selects the next enabled step settings page. (Block 1122). The term 'next' in block 1122 refers to the index of the step settings pages 308 in a round robin ordering. For example, step settings page 308-1 comes next after step settings page 308-0, step settings page 308-2 comes next after step settings page 308-1, . . . , step settings page 308-*x* comes next after step settings page 308-(*x*−1), and step settings page 308-0 comes next after step settings page 308-*x*. After selecting the next enabled step setting page at block 1122, control returns to block 1104 where the sequencer circuitry 228 provides the ADC circuitry 236 with values from the newly selected step settings page.

Notably, the values stored in a given step settings page, including the STEPx_AINP field 902 and STEPx_AINN field 904, are independent of the index of the step settings page.

For example, step settings page 308-0 may store a selection of analog input 102-7 while step settings page 308-1 stores a selection of analog input 102-*n*, step settings page 308-2 stores a selection of analog input 102-0. More generally, while the sequencer circuitry 228 implements a sequence by following the indexed order of the step settings pages 308, the settings used by the ADC circuitry 236 during sequence may change in any arbitrary order, a pattern set by the client device 110 before run time, or no pattern at all.

If all enabled step settings page has been selected in the current sequence iteration (Block 1120: Yes), the monitor circuitry 230 increments the sequence counter stored in the status data 310. (Block 1124). The sequencer circuitry 228 then determines whether it is operating in continuous sequence mode. (Block 1126). In examples described herein, the sequencer circuitry 228 executes block 1126 by checking whether the SEQ_MODE field 406 in the general settings page 302 stores the bits 11.

If the sequencer circuitry 228 is in continuous sequence mode (Block 1126: Yes), control returns to block 1122 where the sequencer circuitry 228 selects the next enabled step settings page 308, thereby beginning another iteration of the sequence. Alternatively, if the sequencer circuitry 228 is not in continuous sequence mode (Block 1126: No), then the sequencer circuitry 228 is in single sequence mode as the other three possible values stored in the SEQ_MODE field 406 were already checked at blocks 1116, 1118, and 1126. Accordingly, control returns to block 1020 in such an example because the sequencer circuitry 228 has successfully completed one iteration of the sequence (as indicated above by Block 1120: Yes). FIG. 11 shows how, while any execution of a step settings page includes blocks 1106-1114, the structure of the memory 234 provides the client device 110 a large amount of flexibility to determine, before run time: when settings used by the ADC circuitry 236 change, and b) what settings values the ADC circuitry 236 changes to.

Figure 12:
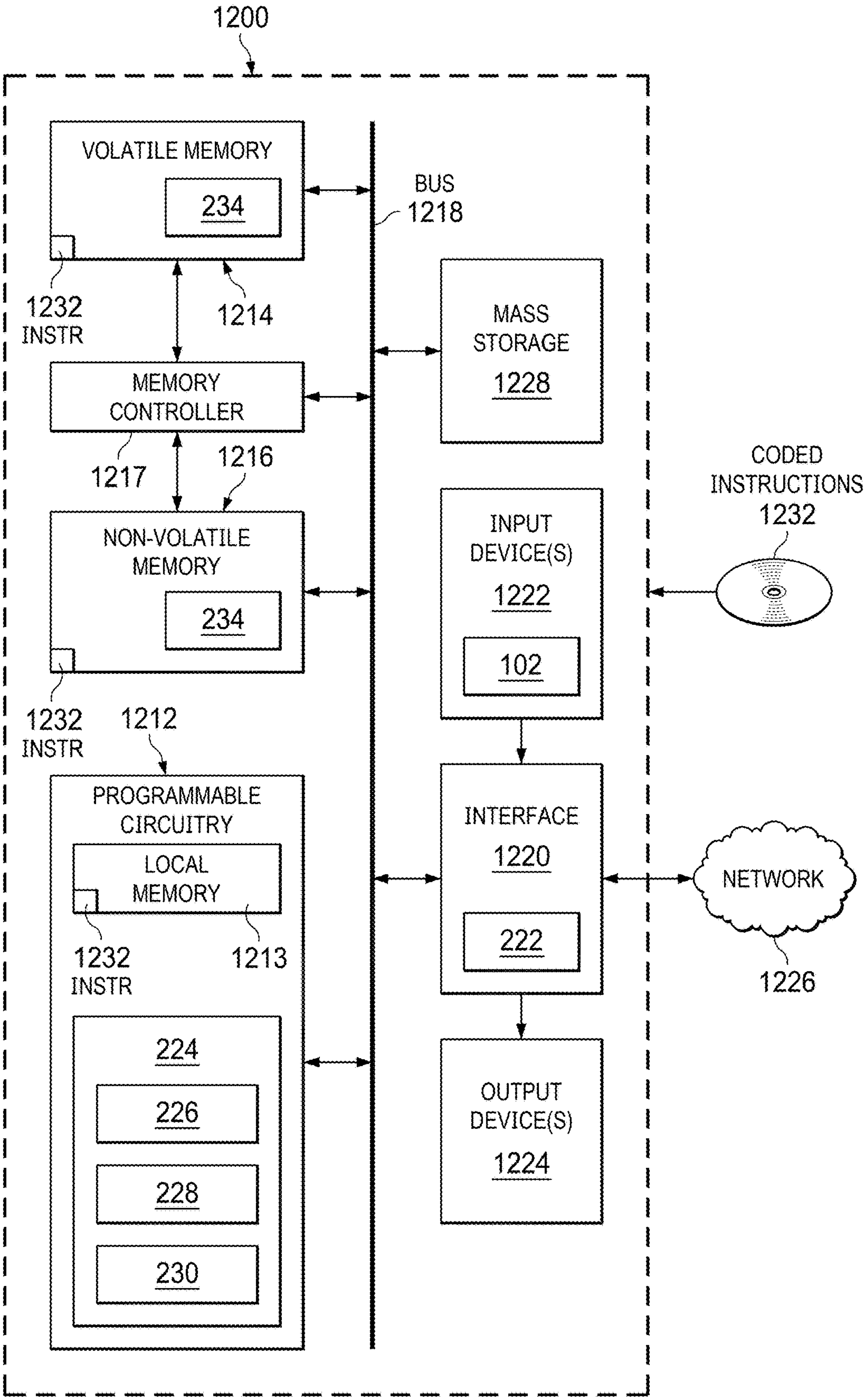
FIG. 12 is a block diagram of an example processing platform including programmable circuitry structured to execute, instantiate, or perform the example machine-readable instructions or perform the example operations of FIGS. 10 and 11 to implement the multiplexed ADC circuitry 108 of FIG. 2.

FIG. 12 is a block diagram of an example programmable circuitry platform 1200 structured to one or a combination of execute or instantiate one or more of the example machine-readable instructions or the example operations of FIGS. 10 and 11 to implement the multiplexed ADC circuitry 108 of FIG. 2. The programmable circuitry platform 1200 can be implemented within, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing or electronic device.

The programmable circuitry platform 1200 of the illustrated example includes programmable circuitry 1212. The programmable circuitry 1212 of the illustrated example is hardware. For example, the programmable circuitry 1212 can be implemented by one or more integrated circuits, logic circuits, FPGAs, microprocessors, CPUs, GPUs, DSPs, or microcontrollers from any desired family or manufacturer. The programmable circuitry 1212 may be implemented by one or more semiconductor based (e.g., silicon based) devices. In this example, the programmable circuitry 1212 implements the initializer circuitry 226, the sequencer circuitry 228, the monitor circuitry 230, and, more generally, the controller circuitry 224.

The programmable circuitry 1212 of the illustrated example includes a local memory 1213 (e.g., a cache, registers, etc.). The programmable circuitry 1212 of the illustrated example is in communication with main memory 1214, 1216, which includes a volatile memory 1214 and a non-volatile memory 1216, by a bus 1218. The volatile memory 1214 may be implemented by one or more Synchronous Dynamic Random Access Memory (SDRAM), Dynamic Random Access Memory (DRAM), RAMBUS® Dynamic Random Access Memory (RDRAM®), or any other type of RAM device. The non-volatile memory 1216 may be implemented by one or a combination of flash memory or any other desired type of memory device. Access to the main memory 1214, 1216 of the illustrated example is controlled by a memory controller 1217. In some examples, the memory controller 1217 may be implemented by one or more integrated circuits, logic circuits, microcontrollers from any desired family or manufacturer, or any other type of circuitry to manage the flow of data going to and from the main memory 1214, 1216. In this example, the main memory 1214, 1216 implements the general settings page 302, the step settings pages 308, the status data 310, the FIFO buffer 312, and, more generally, the memory 234.

The programmable circuitry platform 1200 of the illustrated example also includes interface circuitry 1220. The interface circuitry 1220 may be implemented by hardware in according to any type of interface standard, such as an Ethernet interface, a universal serial bus (USB) interface, a Bluetooth® interface, a near field communication (NFC) interface, a Peripheral Component Interconnect (PCI) interface, or a Peripheral Component Interconnect Express (PCIe) interface.

In the illustrated example, one or more input devices 1222 are connected to the interface circuitry 1220. The input device(s) 1222 permit(s) a user (e.g., a human user, a machine user, etc.) to enter one of or a combination of data or commands into the programmable circuitry 1212. The input device(s) 1222 can be implemented by, for example, one of or a combination of an audio sensor, a microphone, a camera (still or video), a keyboard, a button, a mouse, a touchscreen, a trackpad, a trackball, an isopoint device, or a voice recognition system. In this example, the input devices 1222 implement the analog voltage sources 102.

One or more output devices 1224 are also connected to the interface circuitry 1220 of the illustrated example. The output device(s) 1224 can be implemented, for example, by one of or a combination of display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, or speaker. The interface circuitry 1220 of the illustrated example, thus, includes one of or a combination of a graphics driver card, a graphics driver chip, or graphics processor circuitry such as a GPU.

The interface circuitry 1220 of the illustrated example also includes a communication device such as one of or a combination of a transmitter, a receiver, a transceiver, a modem, a residential gateway, a wireless access point, or a network interface to facilitate exchange of data with external machines (e.g., computing devices of any kind) by a network 1226. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc. In this example, the interface circuitry 1220 implements the interface circuitry 222.

The programmable circuitry platform 1200 of the illustrated example also includes one or more mass storage discs or devices 1228 to store one or more of firmware, software, or data. Examples of such mass storage discs or devices 1228 include one or more magnetic storage devices (e.g., floppy disk, drives, HDDs, etc.), optical storage devices (e.g., Blu-ray disks, CDs, DVDs, etc.), RAID systems, or solid-state storage discs or devices such as flash memory devices and SSDs.

The machine-readable instructions 1232, which may be implemented by the machine-readable instructions of FIGS. 10 and 11, may be stored in one of or a combination of the mass storage device 1228, in the volatile memory 1214, in the non-volatile memory 1216, or on at least one non-transitory computer readable storage medium such as a CD or DVD which may be removable.

While an example manner of implementing the multiplexed ADC circuitry 108 of FIG. 1 is illustrated in FIG. 2, one or more of the elements, processes, or devices illustrated in FIG. 2 may be combined, divided, re-arranged, omitted, eliminated, or implemented in any other way. Further, any of the input multiplexer circuitry 202, the temperate sensor 204, the system monitors 206, the switches 208 and 210, the buffer circuitry 212 and 218, the voltage reference circuitry 214, the reference multiplexer circuitry 216, the clock generator circuitry 220, the interface circuitry 222, the controller circuitry 224, the memory 234, the ADC circuitry 236, or, more generally, the example multiplexed ADC circuitry 108 of FIG. 2, may be implemented by hardware alone or by hardware in combination with software and firmware. Thus, for example, any of the input multiplexer circuitry 202, the temperate sensor 204, the system monitors 206, the switches 208 and 210, the buffer circuitry 212 and 218, the voltage reference circuitry 214, the reference multiplexer circuitry 216, the clock generator circuitry 220, the interface circuitry 222, the controller circuitry 224, the memory 234, the ADC circuitry 236, or, more generally, the example multiplexed ADC circuitry 108, could be implemented by programmable circuitry in combination with one or more machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs. Further still, the example multiplexed ADC circuitry 108 of FIG. 2 may include one or more elements, processes, or devices in addition to, or instead of, those illustrated in FIG. 2, or may include more than one of any or all of the illustrated elements, processes and devices.

Flowcharts representative of example machine-readable instructions, which may be executed by programmable circuitry to at least one of implement or instantiate the multiplexed ADC circuitry 108 of FIG. 2 or representative of example operations which may be performed by programmable circuitry to at least one of implement or instantiate the multiplexed ADC circuitry 108 of FIG. 2, are shown in FIGS. 10 and 11. The machine-readable instructions may be one or more executable programs or portion(s) of one or more executable programs for execution by programmable circuitry such as the programmable circuitry 1212 shown in the example programmable circuitry platform 1200 described below in connection with FIG. 12 and may be one or more function(s) or portion(s) of functions to be performed by the example programmable circuitry (e.g., an FPGA). In some examples, the machine-readable instructions cause an operation, a task, etc., to be carried out or performed in an automated manner in the real-world. As used herein, "automated" means without human involvement.

The program may be embodied in instructions (e.g., software and/or firmware) stored on one or more non-transitory computer readable and/or machine-readable storage medium such as one of or a combination of cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), or any other storage device or storage disk. The instructions of the non-transitory computer readable and/or machine-readable medium may program or be executed by programmable circuitry located in one or more hardware devices, but the entire program or parts thereof could alternatively be executed or instantiated by one or more hardware devices other than the programmable circuitry or embodied in dedicated hardware. The machine-readable instructions may be distributed across multiple hardware devices or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 10 and 11, many other methods of implementing the example multiplexed ADC circuitry 108 may alternatively be used. For example, the order of execution of the blocks of the flowchart(s) may be changed, or some of the blocks described may be changed, eliminated, or combined. Also or alternatively, any or all of the blocks of the flow chart may be implemented by one or more hardware circuits (e.g., processor circuitry, discrete, integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations or local to one or more hardware devices (e.g., a single-core processor (e.g., a single core CPU), a multi-core processor (e.g., a multi-core CPU, an XPU, etc.)). For example, the programmable circuitry may be one of or a combination of a CPU or an FPGA located in the same package (e.g., the same integrated circuit (IC) package or in two or more separate housings), one or more processors in a single machine, multiple processors distributed across multiple servers of a server rack, multiple processors distributed across one or more server racks, etc., or any combination(s) thereof.

The machine-readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, or produce machine executable instructions. For example, the machine-readable instructions may be fragmented and stored on one or more storage devices, disks or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to have them be directly readable, interpretable, or executable by a computing device or other machine. For example, the machine-readable instructions may be stored in multiple parts, which are individually compressed, encrypted, or stored on separate computing devices, the parts when decrypted, decompressed, or combined form a set of one or more computer-executable or machine executable instructions that implement one or more functions or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be stored, data input, network addresses recorded, etc. before the machine-readable instructions or the corresponding program(s) can be executed in whole or in part. Thus, machine-readable, computer readable or machine-readable media, as used herein, may include one or a combination of instructions and program(s) regardless of the particular format or state of the machine-readable instructions or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 10 and 11 may be implemented using executable instructions (e.g., computer readable and/or machine-readable instructions) stored on one or more non-transitory computer readable or machine-readable media. As used herein, the terms non-transitory computer readable medium, non-transitory computer readable storage medium, non-transitory machine-readable medium, and non-transitory machine-readable storage medium are expressly defined to include any type of computer readable storage device or storage disk and to exclude propagating signals and to exclude transmission media. Examples of such non-transitory computer readable medium, non-transitory computer readable storage medium, non-transitory machine-readable medium, or non-transitory machine-readable storage medium include one or more optical storage devices, magnetic storage devices, an HDD, a flash memory, a read-only memory (ROM), a CD, a DVD, a cache, a RAM of any type, a register, or any other storage device or storage disk in which information is stored for any duration (e.g., for extended time periods, permanently, for brief instances, for temporarily buffering, for caching of the information). As used herein, the terms "non-transitory computer readable storage device" and "non-transitory machine-readable storage device" are defined to include any physical (mechanical, magnetic, electromechanical, or electrical) hardware to retain information for a time period, but to exclude propagating signals and to exclude transmission media. Examples of non-transitory computer readable storage devices or non-transitory machine-readable storage devices include one or a combination of random-access memory of any type, read only memory of any type, solid state memory, flash memory, optical discs, magnetic disks, disk drives, or redundant array of independent disks (RAID) systems. As used herein, the term "device" refers to physical structure such as one of or a combination of mechanical, electromechanical, or electrical equipment, hardware, or circuitry that may or may not be implemented with computer readable instructions, machine-readable instructions, etc., or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description.

Modifications are possible in the described embodiments, and other embodiments are possible, within the scope of the claims.

From the foregoing, it will be appreciated that example systems, apparatus, articles of manufacture, and methods have been described that provide greater flexibility to predetermine changes to settings values used by ADC circuitry. Described systems, apparatus, articles of manufacture, and methods improve the efficiency of using a computing device by implementing a memory architecture that includes a step settings pages 308 that can each store a unique combination of settings values as described in FIG. 9, corresponding enable bits 306 that are used to include or exclude a given step settings page 308-*x* in a sequence of operations, and a general settings page that stores conditions further defining when to start ADC conversions, which settings to start the conversions with, when to stop ADC conversions, when to change values of the settings used by the ADC, the status of currently ongoing ADC conversions, etc. Described systems, apparatus, articles of manufacture, and methods are also directed to one or more improvement(s) in the operation of a machine such as a computer or other electronic, electromechanical, or mechanical device.

What is claimed is:

1. An apparatus comprising:

analog to digital converter (ADC) circuitry having an Input terminal and an output terminal;

a memory having: an input terminal coupled to the output terminal of the ADC circuitry, and an output terminal; and control circuitry coupled to the memory and configured to:

perform a sequence of operations responsive to instructions in memory, wherein the sequence of operations includes at least one of:

instructing the ADC circuitry to perform a first number of conversions using first settings values stored in the memory;

instructing the ADC circuitry to perform a second number of conversions using second settings values stored in the memory; and skipping third settings values in the memory; and report, during the performance of the conversions and to an external device, one or more of:

a description of which settings values are currently being used by the ADC circuitry;

a number of conversions completed by the ADC circuitry using the current settings values; or a number of iterations of the sequence completed by the ADC circuitry.

2. The apparatus of claim 1, wherein:

the first settings values, the second settings values, and the third settings values are different values for a shared set of parameters; and the ADC circuitry performs conversion operations responsive to the parameters.

3. The apparatus of claim 1, further including interface circuitry, wherein, before the ADC circuitry performs the sequence of operations, the interface circuitry is configured to:

receive the first settings values and the second settings values from an external device; and receive an instruction from the external device to include the first settings values and the second settings values during the sequence; and receive an instruction to skip the third settings values during the sequence.

4. The apparatus of claim 3, wherein the memory includes:

a first step settings page storing the first settings values;

a second step settings page storing the second settings values;

a third step settings page storing the third settings values; and a general settings page storing enable bits that describe the instructions from the external device regarding which settings values to include and exclude from the sequence.

5. The apparatus of claim 4, wherein the control circuitry further includes sequencer circuitry configured to:

obtain the first number of conversions stored on the first step settings page;

instruct the ADC circuitry to perform the first number of conversions using the first settings values;

after the first number of conversions, obtain the second number of conversions stored on the second step settings page; and instruct the ADC circuitry to perform the second number of conversions using the second settings values.

6. The apparatus of claim 1, further including:

multiplexer circuitry having a first input terminal, a second input terminal, a third input terminal, a first output terminal, and a second output terminal coupled to a fourth input terminal of the ADC circuitry; and buffer circuitry having an input terminal coupled to the first output terminal of the multiplexer and an output terminal coupled to the third input terminal of the ADC circuitry.

7. The apparatus of claim 1, further including interface circuitry configured to communicate with an external device using a Serial Peripheral Interface (SPI) protocol.

8. The apparatus of claim 1, further including:
- a multiplexer having: a first input terminal, a plurality of input terminals, a first output terminal, and a second output terminal;
- a buffer having a first input terminal coupled to the first output terminal of the multiplexer and a second input terminal coupled to the second output terminal of the multiplexer;
- a first switch having a first terminal coupled to the first output terminal of the multiplexer, a second terminal coupled to the first output terminal of the buffer, and a control terminal;
- a second switch having a first terminal coupled to the second output terminal of the multiplexer, a second terminal coupled to the second output terminal of the buffer, and a control terminal; and
- interface circuitry having a first input terminal coupled to the output terminal of the ADC circuitry, a second input terminal, a plurality of input terminals configured to be coupled to an external device, a first output terminal, and a plurality of output terminals configured to be coupled to the external device.

9. An apparatus comprising:
- initialization circuitry configured to:
  - enable a first step settings page and a second step settings page using a first enable bit and a second enable bit stored in memory; and
  - disable a third step settings page using a third enable bit in the memory;
- sequencer circuitry configured to execute a sequence of operations, the sequence including:
  - instruct ADC circuitry to perform, in a sequence, different numbers of conversions using different settings values, the settings values provided from the first step settings page and the second step settings page responsive to the first enable bit and the second enable bit;
  - skip the third step settings page responsive to the third enable bit; and
- monitor circuitry configured to report, during the performance of the conversions and to an external device, one or more of:
  - an index of the step settings page that corresponds to the settings values currently being used by the ADC circuitry;
  - a number of conversions completed by the ADC circuitry using a current step settings page; or
  - a number of iterations of the sequence completed by the ADC circuitry.

10. The apparatus of claim 9, wherein the initialization circuitry is configured to:
- enable the first step settings pages by writing a first logical value to a first enable bit within a general settings page in the memory to a first logical value;
- enable the second step settings pages by writing the first logical value to a second enable bit within the general settings page; and
- disable the third step settings pages by writing a second logical value to a third enable bit within the general settings page.

11. The apparatus of claim 10, wherein the general settings page stores a bit that indicates when the sequencer circuitry is to start execution of the sequence of operations.

12. The apparatus of claim 10, further including monitor circuitry configured to:
- provide a Data Ready (DRDY) signal to an external device, the DRDY signal indicative of when the ADC circuitry has finished a conversion; and
- responsive to a value stored on the general settings page, update the DRDY signal whenever the ADC circuitry has completed: a) a single conversion, b) a threshold number of conversions, c) a step settings page, or d) an iteration of the sequence.

13. The apparatus of claim 12, wherein the monitor circuitry is further configured to:
- use a falling edge of the DRDY signal to report a conversion is completed, the falling edge responsive to a first instruction and a first comparison between a) a depth of a buffer that stores a digital value produced by the completed conversion, and b) a first threshold value; or
- use a rising edge of the DRDY signal to report a conversion is completed, the rising responsive to a second instruction and a second comparison between a) a depth of a buffer that stores a digital value produced by the completed conversion, and b) a second threshold value.

14. The apparatus of claim 9, wherein a step settings page includes one or more of:
- selections of a positive analog input and a negative analog input for the ADC circuitry;
- a selection of whether the ADC circuitry uses an external or internal reference voltage;
- a range of values that are acceptable for use as the external reference voltage;
- conversion data coding information for the ADC circuitry;
- a number of conversions for the ADC circuitry to execute using the first settings values;
- an over sampling rate of a digital filter;
- a selection of a mode for the digital filter;
- an offset value for the ADC circuitry; and
- a gain value of the ADC circuitry.

15. A non-transitory machine-readable storage medium comprising:
- a first step settings page storing first Analog to Digital Conversion (ADC) setting values;
- a second step settings page storing second ADC setting values; and
- a third step settings page storing third ADC setting values; and
- a general settings page storing:
  - a first enable bit that enables the first settings page;
  - a second enable bit that disables the second settings page;
  - a third enable bit that enables the third settings page;
- wherein programmable circuitry coupled to the non-transitory machine-readable storage medium is configured to:
- instruct ADC circuitry to perform, in a sequence, different numbers of conversions using different settings values, the settings values provided from the first step settings page and the third step settings page responsive to the first enable bit and the third enable bit;
- skip the second step settings page responsive to the second enable bit; and report, during the performance of the conversions and to an external device, one or more of:

an index of the step settings page that corresponds to the settings values currently being used by the ADC circuitry;

a number of conversions completed by the ADC circuitry using a current step settings page; or a number of iterations of the sequence completed by the ADC circuitry.

16. The non-transitory machine-readable storage medium of claim 15, wherein the general settings page includes a field that indicates whether the ADC circuitry is to perform conversions using: a) a single step settings page one time, b) the single step settings page repeatedly, c) a sequence of step settings pages one time, or d) the sequence of step settings pages repeatedly.

17. The non-transitory machine-readable storage medium of claim 16, wherein:

the first step settings page, the second step settings page, and the third step settings page are part of a plurality of step settings pages stored in the non-transitory machine-readable storage medium; and the general settings page includes fields that defines the first step settings page as a start of the sequence.

18. The non-transitory machine-readable storage medium of claim 16, wherein the general settings page includes a field that describes whether, in response to an instruction from an external device, the ADC circuitry stops performing operations:

immediately;

after a current conversion is completed;

after a current step settings page is completed; or after a current iteration of the sequence is completed.

19. The non-transitory machine-readable storage medium of claim 16, wherein the general settings page includes fields that describes whether programmable circuitry is to provide a Data Ready (DRDY) signal to an external device after the ADC circuitry has completed execution of: a) a single conversion, b) a threshold number of conversions, c) a step settings page, or d) an iteration of the sequence.

20. The non-transitory machine-readable storage medium of claim 15, wherein a step settings page includes one or more of:

selections of a positive analog input and a negative analog input for the ADC circuitry;

a selection of whether the ADC circuitry uses an external or internal reference voltage;

a range of values that are acceptable for use as the external reference voltage;

conversion data coding information for the ADC circuitry;

a number of conversions for the ADC circuitry to execute using the set of settings values;

an over sampling rate of a digital filter:

a selection of a cut-off frequency for the digital filter:

an offset value for the ADC circuitry; and a gain value of the ADO circuitry.

* * * * *